US012813348B2

(12) United States Patent
Chen et al.

(10) Patent No.: US 12,813,348 B2
(45) Date of Patent: Nov. 24, 2026

(54) BONDING TECHNIQUES FOR STACKED TRANSISTOR STRUCTURES

(71) Applicant: Taiwan Semiconductor Manufacturing Company, Ltd., Hsinchu (TW)

(72) Inventors: Han-De Chen, Hsinchu City (TW); Chen-Fong Tsai, Hsinchu City (TW); Chi On Chui, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 355 days.

(21) Appl. No.: 18/513,296

(22) Filed: Nov. 17, 2023

(65) Prior Publication Data

US 2024/0321855 A1 Sep. 26, 2024

Related U.S. Application Data

(60) Provisional application No. 63/492,130, filed on Mar. 24, 2023.

(51) Int. Cl.
*H10W 90/00* (2026.01)
*H10W 72/00* (2026.01)
*H10W 72/30* (2026.01)

(52) U.S. Cl.
CPC ...... *H10W 90/00* (2026.01); *H10W 72/01338* (2026.01); *H10W 72/01371* (2026.01);
(Continued)

(58) Field of Classification Search
CPC . H10W 72/013; H10W 72/073; H10W 72/30; H10W 72/01338; H10W 72/01371;
(Continued)

(56) References Cited

U.S. PATENT DOCUMENTS 9,818,872 B2 11/2017 Ching et al.
9,887,269 B2 2/2018 Ching et al.
(Continued)

FOREIGN PATENT DOCUMENTS

TW 202310247 A 3/2023

*Primary Examiner* — Mouloucoulaye Inoussa
(74) *Attorney, Agent, or Firm* — HAYNES AND BOONE, LLP

(57) ABSTRACT

Bonding techniques for stacked device structures are disclosed herein. An exemplary method includes forming a first insulation layer on a first device component and a second insulation layer on a second device component. A plasma activation process is performed to the first insulation layer and the second insulation layer. After the plasma activation process, an upper portion of the first insulation layer and the second insulation layer includes a plasma activated layer and a lower portion of the first insulation layer and the second insulation layer includes a barrier layer. The plasma activated layers of respective ones of the first insulation layer and the second insulation layer are bonded to form a stacked structure that includes the first device component over the second device component. The first insulation layer bonded to the second insulation layer forms an isolation structure between the first device component and the second device component.

20 Claims, 23 Drawing Sheets

(52) U.S. Cl.
CPC ................. *H10W 72/07311* (2026.01); *H10W 72/07331* (2026.01); *H10W 72/322* (2026.01); *H10W 72/353* (2026.01); *H10W 90/732* (2026.01)

(58) Field of Classification Search
CPC ..... H10W 72/07311; H10W 72/07331; H10W 72/322; H10W 72/353; H10W 90/732; H10W 72/019; H10W 72/0198; H10W 72/941; H10W 72/951; H10W 72/952; H10W 80/016; H10W 80/031; H10W 80/037; H10W 80/301; H10W 80/312; H10W 80/327; H10W 90/792; H10W 74/129; H10W 10/181; H10W 72/90; H10W 72/01938; H10W 72/07355; H10W 72/342; H10B 43/27; H10B 41/27; H10B 41/35; H10B 43/35; H10B 41/20; H10B 43/10; H10B 43/20; H10B 43/40; H10B 43/50; H10P 72/74; H10P 72/7426; H10P 72/743; H10P 90/1914; H10P 14/6522; H10P 14/6532; H10P 14/6922; G11C 5/025; G11C 5/02; G11C 5/06; G11C 16/0483; H10D 84/038; H10D 88/01; H10D 30/6735; H10D 30/6744; H10D 62/121; H10D 84/0128; H10D 84/0167; H10D 84/83; H10D 84/85; H10D 86/201; H10D 84/0177
See application file for complete search history.

(56) References Cited

U.S. PATENT DOCUMENTS

| | | | | |
|---|---|---|---|---|
| 9,899,398 | B1 | 2/2018 | Colinge et al. | |
| 10,032,627 | B2 | 7/2018 | Lee et al. | |
| 10,109,721 | B2 | 10/2018 | Lin et al. | |
| 10,157,799 | B2 | 12/2018 | Ching et al. | |
| 10,199,502 | B2 | 2/2019 | Huang et al. | |
| 10,283,493 | B1 * | 5/2019 | Nishida | G11C 16/0483 |
| 10,290,546 | B2 | 5/2019 | Chiang et al. | |
| 10,475,902 | B2 | 11/2019 | Lee et al. | |
| 10,600,781 | B1 * | 3/2020 | Xiao | G11C 5/025 |
| 12,176,326 | B2 * | 12/2024 | Fong | H10W 72/0198 |
| 2007/0173033 | A1 * | 7/2007 | Allibert | H10P 90/1922 438/455 |
| 2010/0015780 | A1 * | 1/2010 | Kerdiles | H10P 90/1916 257/E21.575 |
| 2011/0128399 | A1 * | 6/2011 | Fujii | H10F 39/018 438/455 |
| 2011/0129986 | A1 * | 6/2011 | Libralesso | H10P 90/1914 438/455 |
| 2011/0177673 | A1 * | 7/2011 | Landru | H10P 90/1916 438/459 |
| 2013/0280539 | A1 * | 10/2013 | Wilken | C23C 16/30 428/447 |
| 2014/0015136 | A1 * | 1/2014 | Gan | H10W 20/20 257/751 |
| 2016/0351436 | A1 * | 12/2016 | Endean | H10P 90/1914 |
| 2017/0221786 | A1 * | 8/2017 | Konishi | H10P 90/1916 |
| 2018/0175008 | A1 * | 6/2018 | Fong | H10D 84/038 |
| 2018/0175036 | A1 | 6/2018 | Ching et al. | |
| 2018/0261623 | A1 * | 9/2018 | Higashi | H10B 43/27 |
| 2018/0277497 | A1 * | 9/2018 | Matsuo | H10W 42/00 |
| 2019/0051524 | A1 * | 2/2019 | Guo | H10P 10/128 |
| 2019/0051628 | A1 * | 2/2019 | Liu | H10W 72/013 |
| 2020/0006278 | A1 * | 1/2020 | Wang | H10W 72/013 |
| 2020/0013765 | A1 * | 1/2020 | Fountain, Jr. | H10P 90/1914 |
| 2020/0051945 | A1 * | 2/2020 | Pan | H10B 43/50 |
| 2020/0105735 | A1 * | 4/2020 | Park | H10D 88/00 |
| 2020/0212004 | A1 * | 7/2020 | Liu | H10W 90/00 |
| 2020/0321251 | A1 * | 10/2020 | Li | H10D 84/038 |
| 2021/0104543 | A1 * | 4/2021 | Xiao | H10B 43/27 |
| 2021/0151414 | A1 * | 5/2021 | Liu | G11C 11/005 |
| 2021/0366907 | A1 * | 11/2021 | Liao | H10D 84/853 |
| 2022/0020725 | A1 * | 1/2022 | Wang | H10P 90/1914 |
| 2022/0068941 | A1 * | 3/2022 | Liu | H10B 10/12 |
| 2022/0130787 | A1 * | 4/2022 | Uzoh | H10W 70/60 |
| 2022/0139867 | A1 * | 5/2022 | Uzoh | H10W 90/00 438/107 |
| 2022/0216227 | A1 * | 7/2022 | Rha | G11C 5/025 |
| 2022/0293556 | A1 * | 9/2022 | Li | H10W 72/0198 |
| 2022/0328521 | A1 * | 10/2022 | Katkar | H10B 43/27 |
| 2023/0140000 | A1 * | 5/2023 | Choi | H10B 43/40 257/314 |
| 2023/0170352 | A1 * | 6/2023 | Bao | H10D 84/856 257/351 |
| 2023/0178435 | A1 * | 6/2023 | Huang | H10D 64/017 257/351 |
| 2023/0207397 | A1 * | 6/2023 | Gardner | H10D 86/01 257/347 |
| 2023/0290748 | A1 * | 9/2023 | Chuang | H10W 90/00 |
| 2023/0402427 | A1 * | 12/2023 | Cheng | H10W 90/00 |
| 2024/0413039 | A1 * | 12/2024 | Shih | H10D 84/85 |

* cited by examiner

BONDING TECHNIQUES FOR STACKED TRANSISTOR STRUCTURES

CROSS-REFERENCE TO RELATED APPLICATIONS

This application claims benefit of U.S. Provisional Patent Application Ser. No. 63/492,130, filed Mar. 24, 2023, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, by reducing minimum IC feature size), thereby improving production efficiency and lowering associated costs. However, such scaling has also increased complexity of IC manufacturing processes. Thus, realizing continued advances in IC devices and their performance requires similar advances in IC manufacturing processes and technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
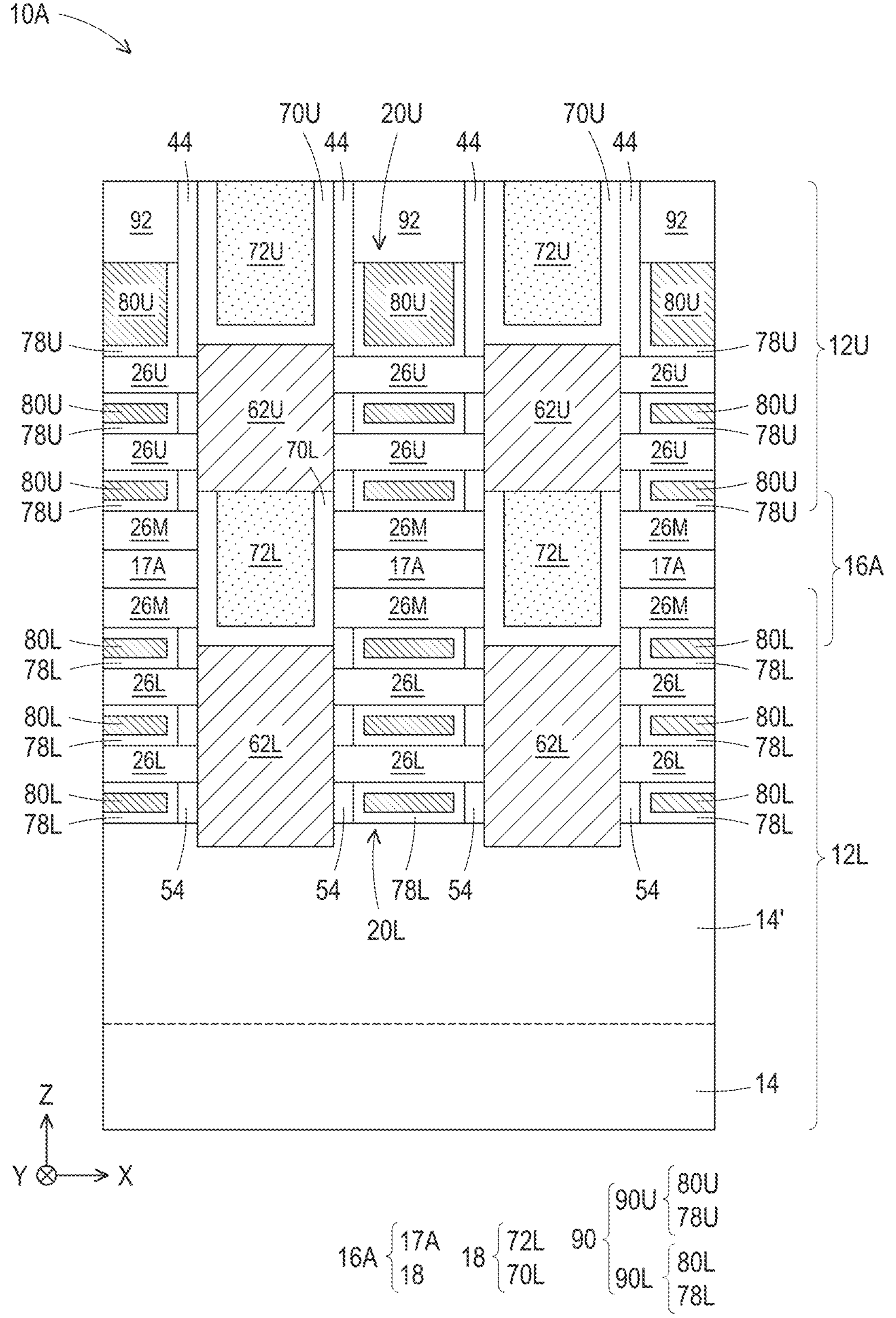
FIG. 1A is a fragmentary cross-sectional view of a stacked device structure, in portion or entirety, according to various aspects of the present disclosure.

The present disclosure relates generally to bonding techniques for stacked device structures, such as a transistor stack having an n-type field effect transistor (NFET) and a p-type field effect transistor (PFET).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of discussion in the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" may encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Stacked transistor structures can provide needed density reduction for advanced integrated circuit (IC) technology nodes. A stacked transistor structure vertically stacks a first transistor (i.e., an upper/top transistor) over a second transistor (i.e., a lower/bottom transistor). The stacked transistor structure provides a complementary field effect transistor (CFET) when the first transistor and the second transistor have opposite conductivity types (i.e., an n-type transistor and a p-type transistor). The first transistor and the second transistor are separated by an insulation layer, which is typically formed by replacing a sacrificial layer of a semiconductor layer stack with a dielectric layer during processing of the semiconductor layer stack to form the first transistor and the second transistor. For example, a semiconductor layer stack may include a sacrificial layer between a first set of semiconductor layers and a second set of semiconductor layers, where the first set of semiconductor layers is processed to form the first transistor and the second set of semiconductor layers is processed to form the second transistor. After partially processing the semiconductor layer stack, forming the insulation layer may include removing the sacrificial layer to form a gap between the first set of semiconductor layers and the second set of semiconductor layers, and filling the gap with an insulation material, such as a dielectric material.

For advanced IC technology nodes, because the sacrificial layer is designed very thin, the resulting gap for filling is very small. Sometimes, it is difficult to adequately remove the sacrificial layer and/or to fill the gap with the dielectric material to form the insulation/dielectric layer. For example, seams may form within the dielectric layer during filling of the gap, such as when the dielectric material pinches off before filling portions of the gap. Seams in the insulation layer may degrade reliability and/or performance of the stacked transistor structure. Also, as the semiconductor layer stack is processed after forming the insulation layer, etchant may enter the seams and undesirably remove the insulation layer and even expose the first set of semiconductor layers, the second set of semiconductor layers, the first transistor, the second transistor, or a combination thereof to the etchant.

As an alternative to bonding techniques that utilize such a gap fill step, some techniques for stacked transistor structures utilize plasma activated wafer bonding to provide an insulation layer between a first transistor and a second transistor. In an exemplary plasma activated wafer bonding process, a first bonding dielectric layer may be formed on a first substrate and a second bonding dielectric layer may be formed on a second substrate. Thereafter, a plasma activation process may be performed to each of the first and second bonding dielectric layers on each of the first and second substrates, respectively, to form plasma activated surfaces thereon. The plasma activated surfaces on each of the first and second bonding dielectric layers on the first and second substrates may then be bonded by bringing the respective plasma activated surfaces into contact with each other. Such techniques eliminate the need to replace a sacrificial layer with a dielectric layer, which may eliminate seam formation in the insulation layer and reduce damage to the insulation layer and/or other device features that may occur via seams during processing. While offering some advantages, at least some existing implementations that use plasma activated wafer bonding generally do not consider the film properties of layers that are disposed beneath the respective bonding dielectric layers. However, for wafer bonding in a CFET process flow, where the dielectric layer thicknesses are limited, it is necessary to consider the potential impacts of plasma treatment on an underlying superlattice structure or CFET channel layer.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to bonding techniques for stacked device structures, such as stacked transistor structures. In some embodiments, a method for controlling a region of a plasma activated surface to within a few nanometers (e.g., also referred to as shallow plasma activation) is provided, while also introducing a dielectric layer (e.g., such as SiCN, SiN, or a combination thereof) that provides a high barrier for diffusion of $H_2O$. As a result, embodiments disclosed herein ensure that an underlying superlattice structure or CFET channel layer is not impacted by the surface plasma treatment (e.g., used for plasma activated wafer bonding), nor is there $H_2O$ induced oxidation to the superlattice structure or CFET channel layer. In some embodiments, a separate barrier layer may be deposited before the dielectric layer, which provides a bonding dielectric layer. In other embodiments, the deposited dielectric layer serves both as the bonding dielectric layer and as the barrier layer. Other embodiments may include different numbers of dielectric and/or barrier layers having various compositions. Additional details of embodiments of the present disclosure are provided below, and additional benefits and/or other advantages will become apparent to those skilled in the art having benefit of the present disclosure.

FIG. 1A provides a fragmentary cross-sectional view of a stacked device structure 10A, in portion or entirety, according to various aspects of the present disclosure. Stacked device structure 10A is fabricated monolithically, and thus may be referred to as a monolithic stacked device structure. Stacked device structure 10A includes a device stack having an upper device 12U vertically stacked over a lower device 12L, a substrate 14, and an isolation structure 16A between and separating the upper device 12U and the lower device 12L. Isolation structure 16A includes isolation structures 17A and isolation structures 18. In some embodiments, the upper device 12U and the lower device 12L are stacked back-to-front. For example, as described further below, isolation structure 16A may bond and/or attach a backside of the upper device 12U to a frontside of the lower device 12L, and isolation structure 16A may be referred to as a bonding layer/structure. FIG. 1A has been simplified for the sake of clarity to better understand the inventive concepts of the present disclosure. Additional features may be added to the stacked device structure 10A, and some of the features described below may be replaced, modified, or eliminated in other embodiments of the stacked device structure 10A.

In FIG. 1A, the upper device 12U and the lower device 12L each include at least one electrically functional device, such as an upper transistor 20U and a lower transistor 20L, respectively. Stacked device structure 10A thus includes a transistor stack having a top transistor (e.g., transistor 20U) and a bottom transistor (e.g., transistor 20L) separated and/or electrically isolated from one another by isolation structure 16A. In some embodiments, the lower transistor 20L and the upper transistor 20U are transistors of an opposite conductivity type. For example, transistor 20L is a p-type transistor, and transistor 20U is an n-type transistor, or vice versa. In such embodiments, the lower transistor 20L and the upper transistor 20U form a CFET. In some embodiments, the lower transistor 20L and the upper transistor 20U are transistors of a same conductivity type. For example, transistor 20L and transistor 20U are both n-type transistors or both p-type transistors.

Device 12U includes various features and/or components, such as semiconductor layers 26U, semiconductor layers 26M, gate spacers 44, inner spacers 54, epitaxial source/ drains 62U, a contact etch stop layer (CESL) 70U, an interlayer dielectric (ILD) layer 72U, gate dielectrics 78U and gate electrodes 80U (which collectively form gate stacks 90U), and hard masks 92. Device 12L also includes various features and/or components, such as mesas 14' (e.g., extensions of substrate 14), semiconductor layers 26L, semiconductor layers 26M, substrate isolation structures, inner spacers 54, epitaxial source/drains 62L, a CESL 70L, an ILD layer 72L, and gate dielectrics 78L and gate electrodes 80L (which collectively form gate stacks 90L). A respective gate stack 90U and a respective gate stack 90L are collectively referred to as a gate 90 of stacked device structure 10A, which may be a metal gate or a high-k/metal gate of a respective CFET. Gate stacks 90U are separated from gate stacks 90L by isolation structures 17A and semiconductor layers 26M, and epitaxial source/drains 62U are separated from epitaxial source/drains 62L by isolation structures 18. In stacked device structure 10B, discussed below, isolation structures 17B may provide electrical isolation of channels and/or gates of stacked devices, and isolation structures 18 may provide electrical isolation of source/drains of stacked devices.

In the depicted embodiment, the lower transistor 20L is a GAA transistor. For example, the lower transistor 20L has two channels provided by semiconductor layers 26L (also referred to as channel layers or channels), which are suspended over substrate 14 and extend between respective source/drains (e.g., epitaxial source/drains 62L). In some embodiments, the lower transistor 20L includes more or less channels (and thus more or less semiconductor layers 26L). Transistor 20L further has gate stack 90L disposed over its semiconductor layers 26L and between its epitaxial source/drains 62L, and inner spacers 54 are disposed between its gate stack 90L and its epitaxial source/drains 62L. Along a gate widthwise direction (e.g., in an X-Z plane), gate stack 90L is over top semiconductor layer 26L, between semiconductor layers 26L, and between bottom semiconductor layer 26L and substrate 14. Along a gate lengthwise direction (e.g., in a Y-Z plane), gate stack 90L wraps around semiconductor layers 26L. During operation of the GAA transistor, current can flow through semiconductor layers 26L and between epitaxial source/drains 62L. Semiconductor layers 26M (also referred to as dummy channel layers or dummy channels) are suspended over substrate 14 and extend between respective isolation structures 18, and isolation structures 17A are disposed between semiconductor layers 26M of device 12L/transistor 20L and semiconductor layers 26M of device 12U/transistor 20U.

In the depicted embodiment, the upper transistor 20U is also a GAA transistor. For example, the upper transistor 20U has two channels provided by semiconductor layers 26U (also referred to as channel layers or channels), which are suspended over substrate 14 and extend between respective source/drains (e.g., epitaxial source/drains 62U). In some embodiments, the upper transistor 20U includes more or less channels/semiconductor layers 26U. Transistor 20U further has gate stack 90U disposed over its semiconductor layers 26U and between its epitaxial source/drains 62U, gate stack 90U disposed between respective gate spacers 44, inner spacers 54 disposed between its gate stack 90U and its epitaxial source/drains 62U, and hard masks 92 disposed over the gate stack 90U. Along a gate widthwise direction, gate stack 90U is over top semiconductor layer 26U, between semiconductor layers 26U, and between bottom semiconductor layer 26U and semiconductor layer 26M. Along a gate lengthwise direction, gate stack 90U wraps around semiconductor layers 26U. During operation of the GAA transistor, current can flow through semiconductor layers 26U and between epitaxial source/drains 62U.

Fabricating stacked device structure 10A monolithically provides isolation structure 16A with isolation structures 17A and isolation structures 18 between channel regions and source/drain regions, respectively, of device 12L and device 12U. For example, a respective isolation structure 17A is between a channel region of the lower transistor 20L and a channel region of the upper transistor 20U (e.g., between channels and/or gates thereof), and isolation structures 18 are between source/drain regions of the lower transistor 20L and source/drain regions of the upper transistor 20U. In the depicted embodiment, the respective isolation structure 17A is between semiconductor layers 26M of the lower transistor 20L and the upper transistor 20U, and isolation structures 18 are between epitaxial source/drains 62L of the lower transistor 20L and epitaxial source/drains 62U of the upper transistor 20U. Accordingly, isolation structures 17A may function as channel isolation structures and/or gate isolation structures, and isolation structures 18 may function as source/drain isolation structures. Isolation structures 17A and isolation structures 18 may include a single layer or multiple layers. Isolation structures 17A and isolation structures 18 include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). As described below, implementing the bonding techniques described herein may provide isolation structures 17A with a first portion having a first composition and a second portion having a second composition, where the second composition is different than the first composition. Isolation structures 17A and isolation structures 18 may include the same or different materials and/or configurations. In the depicted embodiment, a thickness of isolation structures 17A is less than a thickness of isolation structures 18, and a configuration of isolation structures 17A is different than a configuration of isolation structures 18. In some embodiments, isolation structures 18 are formed by a portion of CESL 70L and ILD layer 72L, such as depicted.

Substrate 14, semiconductor layers 26U, semiconductor layers 26M, and semiconductor layers 26L include an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 14 semiconductor layers 26U, semiconductor layers 26M, and semiconductor layers 26L include silicon. In some embodiments, semiconductor layers 26U and semiconductor layers 26L include different semiconductor materials, such as silicon and silicon germanium, respectively, or vice versa. In some embodiments, substrate 14 is a semiconductor-on-insulator substrate, such as a silicon-on-insulator substrate, a silicon germanium-on-insulator substrate, or a germanium-on-insulator substrate. Substrate 14 (including mesas 14' extending therefrom) may include various doped regions, such as p-wells and n-wells. The n-wells are doped with n-type dopants, such as phosphorus, arsenic, other n-type dopant, or a combination thereof. The p-wells are doped with p-type dopants, such as boron, indium, other p-type dopant, or a combination thereof.

Gate spacers 44 are disposed along sidewalls of upper portions of gate stacks 90U, inner spacers 54 are disposed under gate spacers 44 along sidewalls of gate stacks 90U and/or gate stacks 90L, and fin/mesa spacers may be disposed along sidewalls of mesas 14'. Inner spacers 54 are disposed between semiconductor layers 26 and between bottom semiconductor layers 26 and mesas 14'. Gate spacers 44, inner spacers 54, and fin spacers include a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). Gate spacers 44, inner spacers 44, and fin spacers may include different materials and/or different configurations (e.g., different numbers of layers). In some embodiments, gate spacers 44, inner spacers 54, fin spacers, or a combination thereof have a multilayer structure. In some embodiments, gate spacers 44 and/or fin spacers include more than one set of spacers, such as seal spacers, offset spacers, sacrificial spacers, dummy spacers, main spacers, or a combination thereof. The various sets of spacers may have different compositions.

Gate 90 is disposed between epitaxial source/drain stacks, where each epitaxial source/drain stack includes a respective epitaxial source/drain 62U, a respective epitaxial source/drain 62L, and a respective isolation structure 18 disposed therebetween. Epitaxial source/drains 62L and epitaxial source/drains 62U may have the same or different compositions and/or materials depending on configurations of their respective transistors. Epitaxial source/drains 62L and epitaxial source/drains 62U may be doped with n-type dopants and/or p-type dopants. In some embodiments, epitaxial source/drains 62L and/or epitaxial source/drains 62U include silicon that may be doped with carbon, phosphorous, arsenic, other n-type dopant, or a combination thereof (e.g., Si:C epitaxial source/drains, Si:P epitaxial source/drains, or Si:C:P epitaxial source/drains). In some embodiments, epitaxial source/drains 62L and/or epitaxial source/drains 62U include silicon germanium or germanium, which may be doped with boron, other p-type dopant, or a combination thereof (e.g., Si:Ge:B epitaxial source/drains). In the depicted embodiment, epitaxial source/drains 62L include silicon germanium doped with boron, and epitaxial source/drains 62U include silicon doped with phosphorous. In some embodiments, epitaxial source/drains 62L and/or epitaxial source/drains 62U include more than one epitaxial semiconductor layer, where the epitaxial semiconductor layers may include the same or different materials and/or the same or different dopant concentrations. In some embodiments, epitaxial source/drains 62L and/or epitaxial source/drains 62U include materials and/or dopants that achieve a desired tensile stress and/or compressive stress in adjacent channel regions (e.g., formed by semiconductor layers 26U and semiconductor layers 26L). As used herein, source/drain region, epitaxial source/drain, epitaxial source/drain feature, etc. may refer to a source of a device (e.g., the upper transistor 20U and/or the lower transistor 20L), a drain of a device (e.g., the upper transistor 20U and/or the lower transistor 20L), or a source and/or a drain of multiple devices.

ILD layer 72U and ILD layer 72L include a dielectric material, such as silicon oxide, carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), xerogel, aerogel, amorphous fluorinated carbon, parylene, benzocyclobutene-based (BCB) material, polyimide, other dielectric material, or a combination thereof. In some embodiments, ILD layer 72U and/or ILD layer 72L include a dielectric material having a dielectric constant that is less than a dielectric constant of silicon dioxide. CESL 70L and CESL 70U include a material different than a material of ILD layer 72U and ILD layer 72L, respectively. For example, where ILD layer 72U and ILD layer 72L include a low-k dielectric material that includes silicon and oxygen, CESL 70L and CESL 70U may include a material composed of silicon and nitrogen and/or carbon. In some embodiments, ILD layer 72U, ILD layer 72L, CESL 70L, CESL 70U, or a combination thereof may have a multilayer structure.

Gate dielectrics 78U and gate dielectrics 78L each include at least one gate dielectric layer. In some embodiments, gate dielectrics 78U and/or gate dielectrics 78L include an interfacial layer that includes a dielectric material, such as $SiO_2$, $SiGeO_x$, HfSiO, SiON, other dielectric material, or a combination thereof. In some embodiments, gate dielectrics 78U and/or gate dielectrics 78L include a high-k dielectric layer, formed over the interfacial layer, which includes a dielectric material having a dielectric constant that is greater than a dielectric constant of silicon dioxide ($k \approx 3.9$), such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $LaO_3$, $La_2O_3$, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, $HfO_2$—$Al_2O_3$, other high-k dielectric material, or a combination thereof. For example, gate dielectrics 78U and/or gate dielectrics 78L include a hafnium-based oxide (e.g., $HfO_2$) layer and/or a zirconium-based oxide (e.g., $ZrO_2$) layer. In some embodiments, the interfacial layer and/or the high-k dielectric layer may have a multilayer structure.

Gate electrodes 80U and gate electrodes 80L are disposed over gate dielectrics 78U and gate dielectrics 78L, respectively. Gate electrodes 80U and gate electrodes 80L each include at least one electrically conductive gate layer. The electrically conductive gate layer includes an electrically conductive material, such as Al, Cu, Ti, Ta, W, Mo, Co, TaN, NiSi, CoSi, TiN, WN, TiAl, TiAlN, TaCN, TaC, TaSiN, other electrically conductive material, or a combination thereof. In some embodiments, gate electrodes 80U and/or gate electrodes 80L include a work function layer. The work function layer is an electrically conductive layer tuned to have a desired work function, such as an n-type work function or a p-type work function. The work function layer includes work function metal(s) and/or alloys thereof, such as Ti, Ta, Al, Ag, Mn, Zr, W, Ru, Mo, TiC, TiAl, TiAlC, TiAlSiC, TaC, TaCN, TaSiN, TiSiN, TiN, TaN, TaSN, WN, WCN, $ZrSi_2$, $MoSi_2$, $TaSi_2$, $NiSi_2$, TaAl, TaAlC, TaSiAlC, TiAlN, or a combination thereof. In some embodiments, gate electrodes 80U and/or gate electrodes 80L include an electrically conductive bulk layer over a respective gate dielectric and/or work function layer. The bulk layer includes an electrically conductive material, such as Al, W, Cu, Ti, Ta, TiN, TaN, polysilicon, other metal(s), alloys thereof, or a combination thereof. In some embodiments, gate electrodes 80U and/or gate electrodes 80L include a barrier (blocking) layer over a respective work function layer and/or gate dielectric layer. The barrier layer includes a material that prevents or eliminates diffusion and/or reaction of constituents between adjacent layers and/or promotes adhesion between adjacent layers, such as between the work function layer and the bulk layer. In some embodiments, the barrier layer includes metal and nitrogen, such as titanium nitride, tantalum nitride, tungsten nitride (e.g., $W_2N$), titanium silicon nitride (TiSiN), tantalum silicon nitride (TaSiN), other metal nitride, or a combination thereof.

Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or a combination thereof.

Figure 1B:
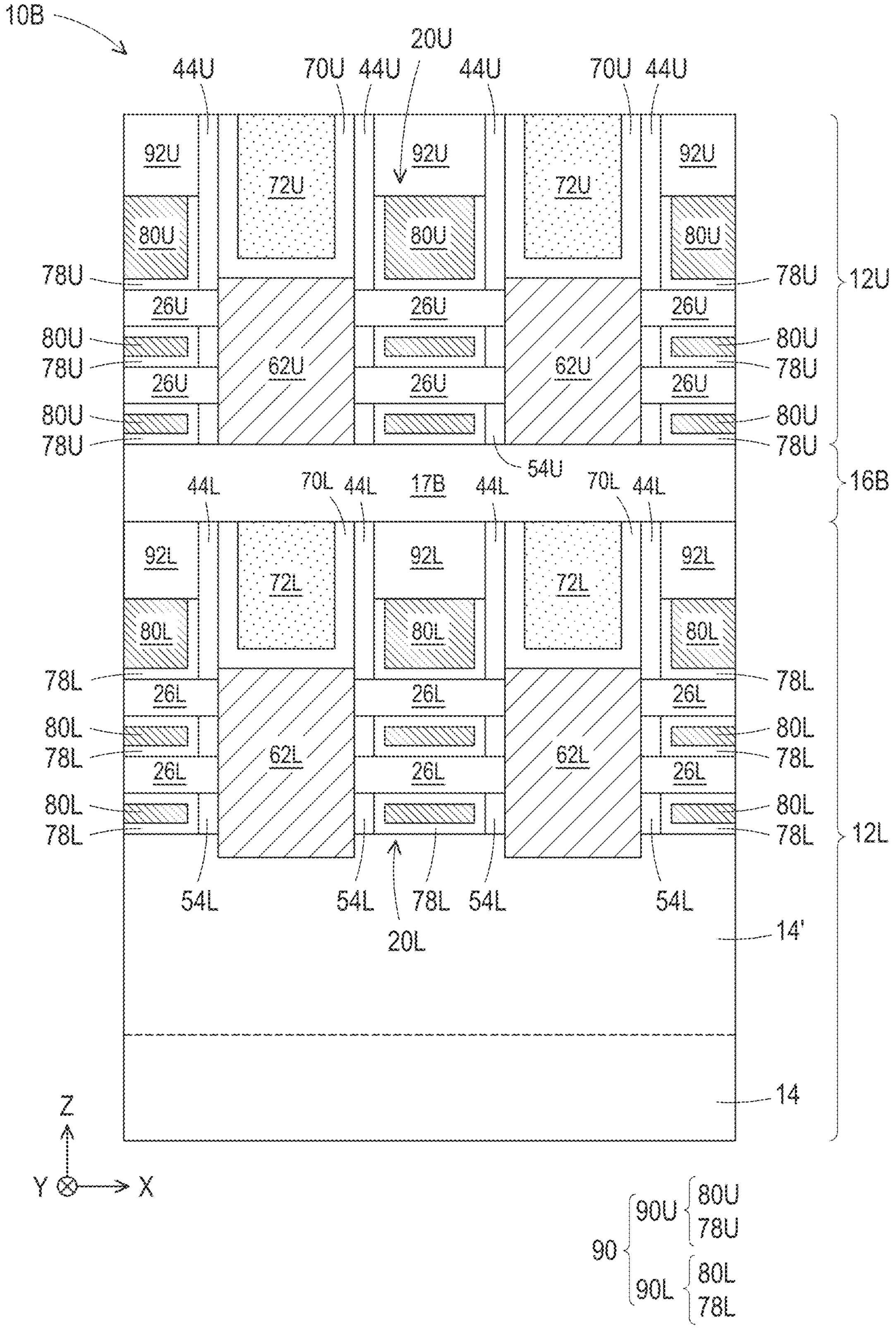
FIG. 1B is a fragmentary cross-sectional view of another stacked device structure, in portion or entirety, according to various aspects of the present disclosure.

FIG. 1B provides a fragmentary cross-sectional view of a stacked device structure 10B, in portion or entirety, according to various aspects of the present disclosure. Stacked device structure 10B is fabricated sequentially, and thus may be referred to as a sequential stacked device structure. Since stacked device structure 10B is similar in many respects to stacked device structure 10A, similar features of stacked device structure 10B and stacked device structure 10A are identified by the same reference numerals for clarity and simplicity. For example, stacked device structure 10B includes device stack (e.g., upper device 12U vertically stacked over lower device 12L) disposed over substrate 14. Stacked device structure 10B includes an isolation structure 16B, instead of isolation structure 16A, between and separating the upper device 12U and the lower device 12L. In some embodiments, the upper device 12U and the lower device 12L are stacked back-to-front. For example, as described further below, isolation structure 16B may bond and/or attach a backside of the upper device 12U to a frontside of the lower device 12L, and isolation structure 16B may be referred to as a bonding layer/structure. FIG. 1B has been simplified for the sake of clarity to better understand the inventive concepts of the present disclosure. Additional features may be added in stacked device structure 10B, and some of the features described below may be replaced, modified, or eliminated in other embodiments of stacked device structure 10B.

In stacked device structure 10B, the lower device 12L and the upper device 12U include at least one electrically functional device, such as the lower transistor 20L and the upper transistor 20U, respectively (which are configured as GAA transistors). Device 12U includes various features and/or components, such as semiconductor layers 26U, gate spacers 44U, inner spacers 54U, epitaxial source/drains 62U, CESL 70U, ILD layer 72U, gate dielectrics 78U and gate electrodes 80U (which collectively form gate stacks 90U), and hard masks 92U. Device 12L also includes various features and/or components, such as mesas 14' (e.g., extensions of substrate 14), semiconductor layers 26L, substrate isolation structures, gate spacers 44L, inner spacers 54L, epitaxial source/drains 62L, CESL 70L, ILD layer 72L, and gate dielectrics 78L and gate electrodes 80L (which collectively form gate stacks 90L). Stacked device structure 10B may further include source/drain contacts, such as upper source/drain contacts disposed in ILD layer 72U and on epitaxial source/drains 62U and lower source/drain contacts disposed in ILD layer 72L and on epitaxial source/drains 62L.

Because stacked device structure 10B is fabricated sequentially, isolation structure 16B is provided with an isolation structure 17B. Gate stacks 90U are separated from gate stacks 90L by isolation structure 17B, the upper device 12U and/or the lower device 12L may not have semiconductor layers 26M (as shown in the embodiment of FIG. 1A), and epitaxial source/drains 62U are separated from epitaxial source/drains 62L by isolation structure 17B. Isolation structure 17B is thus between channel regions and source/drain regions, respectively, of the lower device 12L and the upper device 12U, and isolation structure 17B may provide electrical isolation of both channels/gates and source/drains of stacked devices. For example, isolation structure 17B extends continuously, without interruption between channel regions and source/drain regions of the lower transistor 20L and the upper transistor 20U. Isolation structure 17B may include a single layer or multiple layers. Isolation structure 17B includes a dielectric material, which may include silicon, oxygen, carbon, nitrogen, other suitable dielectric constituent, or a combination thereof (e.g., silicon oxide, silicon nitride, silicon oxynitride, silicon carbide, silicon carbonitride, silicon oxycarbide, silicon oxycarbonitride, or a combination thereof). As described below, implementing the bonding techniques described herein may provide isolation structure 17B with a first portion having a first composition and a second portion having a second composition, where the second composition is different than the first composition.

Figure 2A:
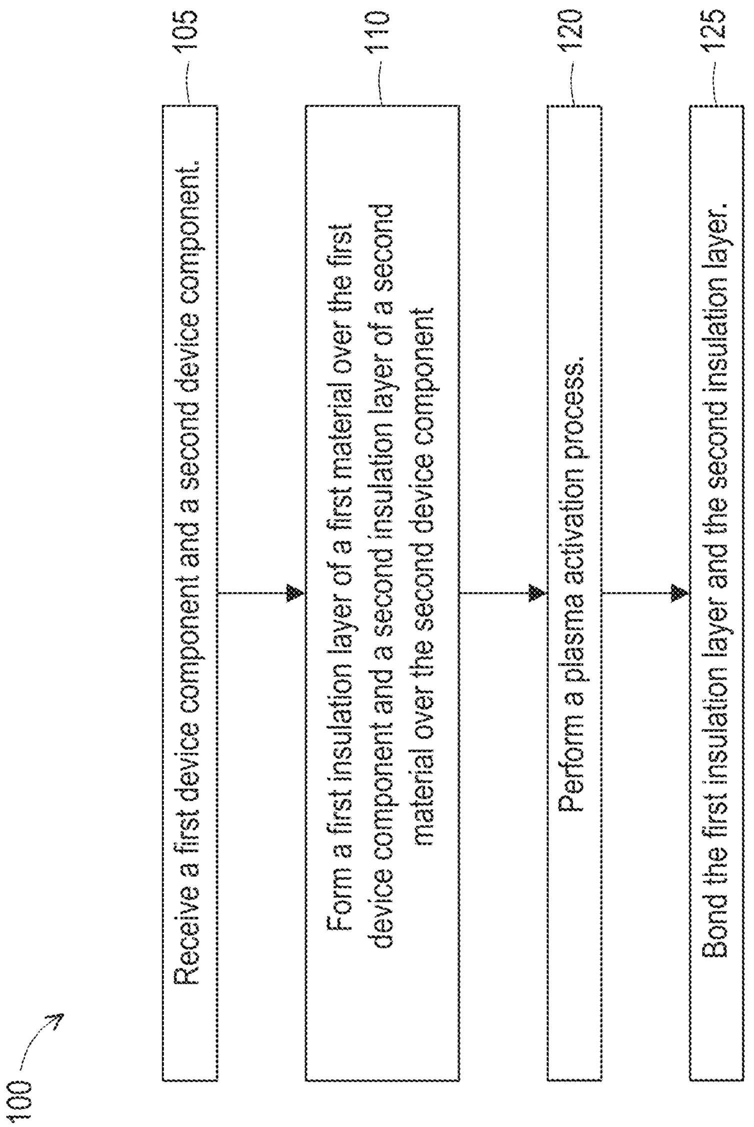
FIG. 2A is a flow chart of a method, in portion or entirety, for bonding components of a stacked device structure, such as the stacked device structures of FIG. 1A and FIG. 1B, according to various aspects of the present disclosure.
Figure 2B:
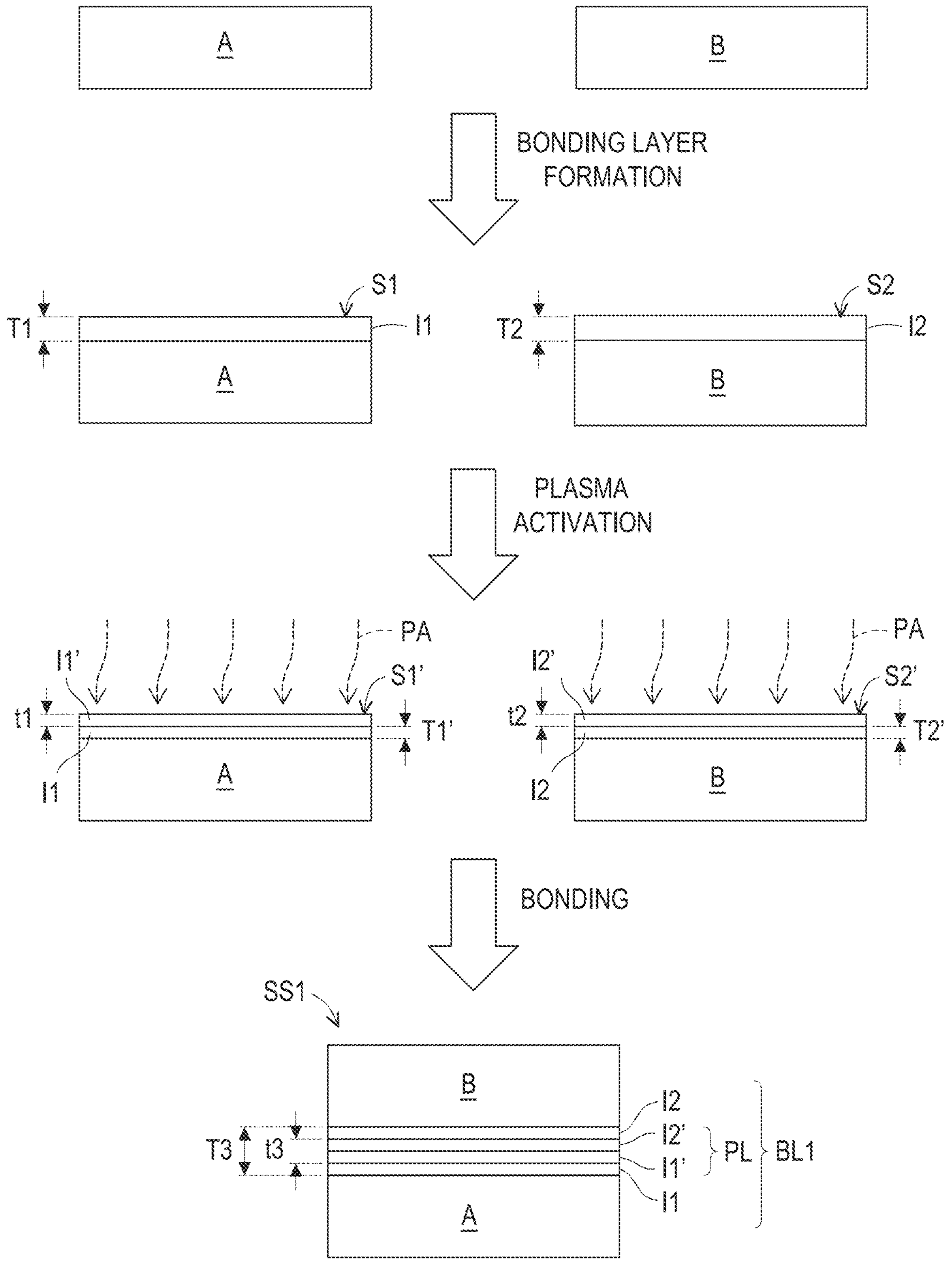
FIGS. 2B, 2C, 2D, and 2E are bonding process flows, in portion or entirety, corresponding with the method of FIG. 2A according to various aspects of the present disclosure.
Figures 2C, 2D, 2E:
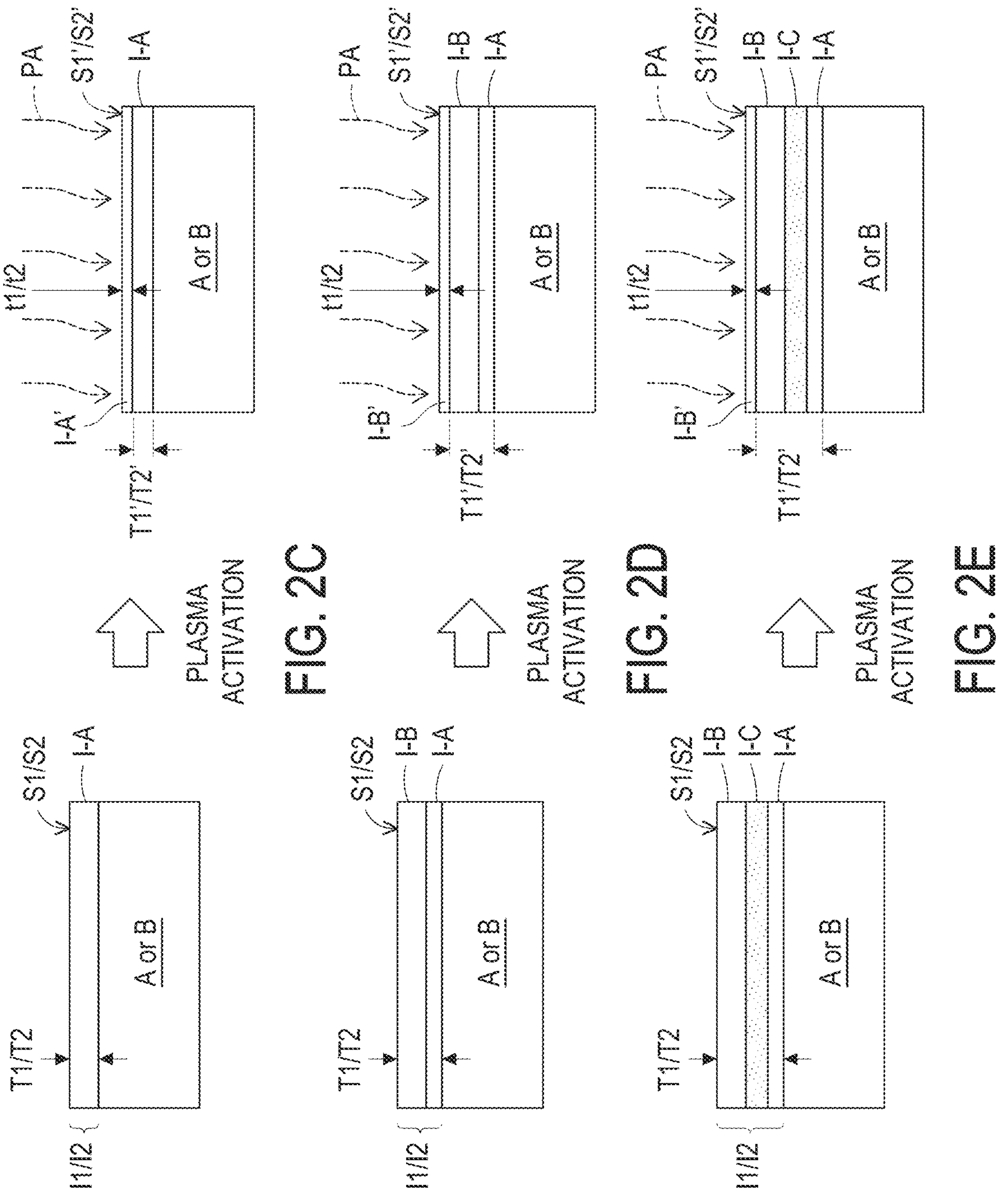

FIG. 2A is a flow chart of a method 100, in portion or entirety, for bonding components of a stacked device structure according to various aspects of the present disclosure. FIG. 2B illustrates a bonding process flow, in portion or entirety, that may correspond with method 100 of FIG. 2A according to various aspects of the present disclosure. FIGS. 2C, 2D, and 2E illustrate embodiments of various insulation layer structures, before and after plasma activation, that may be employed as part of the bonding process flow of FIG. 2B, and that may also correspond with method 100 of FIG. 2A according to various aspects of the present disclosure. FIG. 2A, FIG. 2B, FIG. 2C, FIG. 2D, and FIG. 2E are discussed concurrently herein for ease of description and understanding.

In FIG. 2A and FIG. 2B, method 100 at block 105 includes receiving a first device component (e.g., A) and a second device component (e.g., B). The first device component and the second device component may include a superlattice structure or CFET channel layer, for example, depending on whether a monolithic or sequential CFET process flow is used. Method 100 may proceed to bonding layer formation, for example, by forming a first insulation layer (e.g., I1) of a first material over the first device component and forming a second insulation layer (e.g., I2) of a second material over the second device component at block 110. In accordance with various embodiments, and as discussed further below with reference to FIGS. 2C-2E, each of the first insulation layer and the second insulation layer may each be composed of a single dielectric layer or a plurality of dielectric layers, such as a double dielectric layer or a triple dielectric layer. In other cases, the first insulation layer may be composed of a single dielectric layer and the second insulation layer may be composed of a double dielectric layer or a triple dielectric layer. In still other examples, the first insulation layer may be composed of a double dielectric layer or a triple dielectric layer and the second insulation layer may be composed of a single dielectric layer. Regardless of the exact structure of the first and second insulation layers (e.g., single dielectric layer, double dielectric layer, or triple dielectric layer), the first insulation layer has a first thickness (e.g., T1) and the second insulation layer has a second thickness (e.g., T2), where each of the first thickness and the second thickness is in a range of between about 1-100 nm. In other embodiments, each of the first thickness and the second thickness is in a range of between about 5-25 nm. Further, in various cases, the first and second thicknesses may be equal, the first thickness may be greater than the second thickness, or the second thickness may be greater than the first thickness. In some examples first insulation layer and the second insulation layer may be formed by chemical vapor deposition (CVD), plasma-enhanced CVD (PECVD), atomic layer deposition (ALD), plasma-enhanced ALD (PEALD), physical vapor deposition (PVD) such as a sputtering process, other deposition process, or a combination thereof. In some embodiments, the deposition temperature used to form each of the first insulation layer and the second insulation layer may be less than about 600 degrees Celsius. Deposition temperatures greater than 600 degrees Celsius may cause undesirable diffusion of atoms (e.g., such as interdiffusion of Ge atoms from SiGe layers). In cases where a sputtering process is performed to deposit the first insulation layer and the second insulation layer, an annealing process may be performed immediately thereafter in order to densify each of the first and second insulation layers. CVD- or ALD-deposited first and second insulation layers will have a higher as-deposited density as compared to sputtered layers. As a result, an annealing process following CVD- or ALD-deposition of the first and second insulation layers is optional. In some examples, the second material may be the same as, or similar to, the first material. Stated another way, a coefficient of thermal expansion (CTE) of the first material and the second material may be the same, or similar to each other, in order to prevent warpage of the respective device components (e.g., wafers/substrates) and to minimize overlay/alignment error between first and second device components (e.g., during a wafer bonding process). In accordance with embodiments of the present disclosure, the first and second material (of the first and second insulation layers, respectively) are configured to facilitate dielectric-to-dielectric bonding, provide a high barrier for diffusion of $H_2O$, electrically isolate the first device component and the second device component, and generally ensure that an underlying superlattice structure or CFET channel layer is not impacted by the surface plasma treatment (e.g., used for plasma activated wafer bonding).

Method 100 further includes performing a plasma activation process (e.g., PA), for example, on a bonding surface of the first insulation layer (e.g., S1) and on a bonding surface of the second insulation layer (e.g., S2) at block 120. In some embodiments, the plasma activation process may include an oxygen plasma treatment, an oxygen-hydrogen plasma treatment, or other suitable plasma treatment. As one example, the plasma activation process may be performed at a temperature of less than about 400 degrees Celsius. The plasma activation process forms a first plasma activated layer (e.g., I1') having a first plasma activated surface (e.g., S1') within the first insulation layer, and a second plasma activated layer (e.g., I2') having a second plasma activated surface (e.g., S2') within the second insulation layer. As a result of the plasma activation process, the first insulation layer may have a reduced first thickness (e.g., T1'<T1), the second insulation layer may have a reduced second thickness (e.g., T2'<T2), the plasma activated portion of the first insulation layer (e.g., I1') may have a third thickness (e.g., t1), and the plasma activated portion of the second insulation layer may have a fourth thickness (e.g., t2). In some embodiments, the third thickness and the fourth thickness of the plasma activated portions are each less than about 5 nm. In some embodiments, the third thickness and the fourth thickness of the plasma activated portions are the same. In some embodiments, the third thickness and the fourth thickness of the plasma activated portions are different.

Method 100 at block 125 may proceed with bonding the first insulation layer and the second insulation layer, such that a bonding/insulation layer (e.g., BL1) is provided between the first device component and the second device component. For example, bonding is achieved by flipping over the second device component (e.g., B), aligning the first device component (e.g., A) to the second device component (e.g., B), bringing the first plasma activated surface of the first insulation layer and the second plasma activated surface of the second insulation layer (i.e., S1' and S2') into contact with each other, and performing an annealing process, thereby providing a stacked device structure (e.g., SS1). In some embodiments, the annealing process serves to effectuate bonding of the first and second insulation layers by forming bonds between the activated surfaces (e.g., such as Si—C—Si bonds and/or Si—O—Si bonds) of the first and second insulation layers. The annealing process, in some cases, may also serve to cause dehydration (e.g., of $H_2O$). In some examples, when the first insulation layer and the second insulation layer include a single dielectric layer, the bonds between the activated surfaces may include Si—C—Si bonds and/or Si—O—Si bonds. In some cases, when the first insulation layer and the second insulation layer include a double dielectric layer or a triple dielectric layer, the bonds between the activated surfaces may include Si—O—Si bonds. In the depicted embodiment, the bonding/insulation layer (e.g., BL1) includes the first insulation layer (e.g., I1, having reduced thickness T1'), the second insulation layer (e.g., I2, having reduced thickness T2'), and a plasma activated layer (e.g., PL) composed of the first plasma activated layer (e.g., I1') and the second plasma activated layer (e.g., I2') and disposed between the first and second insulation layers. In some embodiments, the plasma activated layer (e.g., PL) is a silicon-and-oxygen containing layer and/or a silicon-and-carbon containing layer disposed between silicon-and-nitrogen containing insulation layers (e.g., such as when the first insulation layer and the second insulation layer include SiN or SiCN). In various examples, a gradient composition of the bonding dielectric layers (e.g., of the bonding/insulation layer BL1) have interfaces, one or more of which may (in at least some cases) be visible using a line scan of a transmission electron microscope (TEM).

The plasma activated layer (e.g., PL) has a thickness t3, and the bonding/insulation layer (e.g., BL1) has a thickness T3. Thickness t3 is less than or equal to a sum of a thickness of the plasma activated portion of the first insulation layer (e.g., t1) and a thickness of the plasma activated portion of the second insulation layer (e.g., t2). Thickness T3 is a sum of a thickness of the first insulation layer (e.g., the first thickness (e.g., T1) or the reduced first thickness (e.g., T1')), a thickness of the second insulation layer (e.g., the second thickness (e.g., T2) or the reduced second thickness (e.g., T2')), and the thickness of the plasma activated layer (e.g., t3). In some embodiments, thickness T3 is in a range of between about 1-100 nm. In some cases, thickness T3 is in a range of about 10 nm to about 50 nm. In some embodiments, thickness t3 is in a range of about 5 nm to about 10 nm.

In some examples, and prior to bonding the first insulation layer and the second insulation layer, a cleaning process may be performed (e.g., to the surfaces S1, S2 before plasma activation, to the surfaces S1', S2' after plasma activation, or a combination thereof). Such a cleaning process may be performed using an RCA cleaning process including an SC-1 clean (ammonium hydroxide, hydrogen peroxide, and water) and/or an SC-2 clean (hydrochloric acid, hydrogen peroxide, and water). FIG. 2A, FIG. 2B, FIG. 2C, FIG. 2D, and FIG. 2E have been simplified for the sake of clarity to better understand the inventive concepts of the present disclosure. Additional steps may be provided before, during, and after method 100, and some of the steps described may be moved, replaced, or eliminated for additional embodiments of method 100. Additional features may be added in FIGS. 2B-2E, and some of the features described below may be replaced, modified, or eliminated in other embodiments of FIG. 2B-2E.

FIGS. 2C-2E provide further detail regarding exemplary compositions of the first insulation layer (e.g., I1) and the second insulation layer (e.g., I2), before and after plasma activation, in accordance with embodiments of block 110 and 120. Since the first and second insulation layers are the same, the examples of FIGS. 2C-2E may correspond to either the first insulation layer (e.g., I1) formed over the first device component (e.g., A) or the second insulation layer (e.g., I2) formed over the second device component (e.g., B). In an embodiment of block 110, FIG. 2C illustrates an example where the insulation layers (e.g., I1 or I2) include a single dielectric layer (e.g., I-A). The single dielectric layer (e.g., I-A) may have the first thickness (e.g., T1) or the second thickness (e.g., T2), as described above. In some embodiments, the single dielectric layer (e.g., I-A) is composed of a material that includes silicon and nitrogen (e.g., such as silicon nitride (SiN)) or silicon, nitrogen, and carbon (e.g., such as silicon carbonitride (SiCN)). By way of example, SiCN and SiN have a higher resistance to $H_2O$ as compared to $SiO_2$, which is used as a bonding layer in at least some existing processes. As shown in the example of FIG. 2C, the single dielectric layer (e.g., I-A) is formed directly over the underlying superlattice structure or CFET channel layer disposed within the first device component (e.g., A) or the second device component (e.g., B). Thus, the underlying superlattice structure or CFET channel layer is protected from $H_2O$ induced oxidation.

Continuing with the example of FIG. 2C, and in an embodiment of block 120, the plasma activation process exposes the single dielectric layer (e.g., I-A) to a plasma to modify surface conditions of the single dielectric layer (e.g., I-A), which may include modifying surface conditions of the first insulation layer and the second insulation layer. The plasma activation process forms a plasma activated layer (e.g., I-A') having a plasma activated surface (e.g., S1'/S2') within an upper portion of the single dielectric layer (e.g., I-A), where the plasma activated layer (e.g., I-A') is disposed over a lower portion of the single dielectric layer (e.g., I-A) that remains untreated by the plasma activation process. In various examples, the plasma activated surface (e.g., S1'/S2') promotes and/or enhances chemical bonding between the first and second insulation layers compared to the bonding surfaces (e.g., S1/S2) before the plasma activation process. In some embodiments, the plasma activated surface (e.g., S1'/S2') includes $OH^-$ dangling bonds. In some cases, the plasma activated layer (e.g., I-A') may include $SiO_2$ having $OH^-$ dangling bonds. In some examples, and after the plasma activation process, the plasma activated layer (e.g., I-A') may be referred to as the bonding layer and the portion of the single dielectric layer (e.g., I-A) that remains untreated by the plasma activation process may be referred to as a barrier layer (e.g., which provides a high barrier for diffusion of $H_2O$). As a result of the plasma activation process, the single dielectric layer (e.g., I-A) may have the reduced first thickness or the reduced second thickness (e.g., T1'/T2'<T1/T2), and the plasma activated portion of the single dielectric layer (e.g., I-A') may have the third thickness or the fourth thickness (e.g., t1/t2), as described above. After the plasma activation process, and in an embodiment of block 125, plasma activated layers (e.g., I-A') of respective ones of the first device component (e.g., A) and the second device component (e.g., B) may be brought into contact with each other to facilitate the bonding process.

In another embodiment of block 110, FIG. 2D illustrates an example where the insulation layers (e.g., I1 or I2) include a double dielectric layer (e.g., I-A and I-B). The double dielectric layer (e.g., I-A and I-B) may have the first thickness (e.g., T1) or the second thickness (e.g., T2), as described above. In some embodiments, the lower layer of the double dielectric layer (e.g., I-A) is composed of a material that includes silicon and nitrogen (e.g., such as silicon nitride (SiN)) or silicon, nitrogen, and carbon (e.g., such as silicon carbonitride (SiCN)), and the upper layer of the double dielectric layer (e.g., I-B) is composed of a material that includes silicon and oxygen (e.g., such as silicon dioxide ($SiO_2$)) or silicon, oxygen, and nitrogen (e.g., such as silicon oxynitride (SiON)). As previously noted, SiCN and SiN have a higher resistance to $H_2O$ as compared to $SiO_2$. As shown in the example of FIG. 2D, the lower layer of the double dielectric layer (e.g., I-A) is formed directly over the underlying superlattice structure or CFET channel layer disposed within the first device component (e.g., A) or the second device component (e.g., B), thereby protecting the underlying superlattice structure or CFET channel layer from $H_2O$ induced oxidation. Further, as also shown in FIG. 2D, the upper layer of the double dielectric layer (e.g., I-B) is formed over the lower layer of the double dielectric layer (e.g., I-A). In this example, the lower layer of the double dielectric layer (e.g., I-A) may serve as a dedicated barrier layer, while the upper layer of the double dielectric layer (e.g., I-B) provides the bonding layer.

Continuing with the example of FIG. 2D, and in an embodiment of block 120, the plasma activation process exposes the upper layer of the double dielectric layer (e.g., I-B) to a plasma to modify surface conditions of the upper layer of the double dielectric layer (e.g., I-B). The plasma activation process forms a plasma activated layer (e.g., I-B') having a plasma activated surface (e.g., S1'/S2') within an upper portion of the upper layer of the double dielectric layer (e.g., I-B), where the plasma activated layer (e.g., I-B') is disposed over a lower portion of the upper layer of the double dielectric layer (e.g., I-B) that remains untreated by the plasma activation process, and where the untreated lower portion of the upper layer of the double dielectric layer (e.g., I-B) interposes the lower layer of the double dielectric layer (e.g., I-A) and the plasma activated layer (e.g., I-B'). As previously described, the plasma activated surface (e.g., S1'/S2') promotes and/or enhances chemical bonding between the first and second insulation layers compared to the bonding surfaces (e.g., S1/S2) before the plasma activation process. In the present example, the plasma activated surface (e.g., S1'/S2') includes $OH^-$ dangling bonds. In some cases, the plasma activated layer (e.g., I-B') may include $SiO_2$ having $OH^-$ dangling bonds. In some embodiments, the untreated lower portion of the upper layer of the double dielectric layer (e.g., I-B) includes $SiO_2$ or SiON. In some examples, and after the plasma activation process, the plasma activated layer (e.g., I-B') may be referred to as a bonding portion of the bonding layer. In some cases, the non-plasma treated lower portion of the upper layer of the double dielectric layer (e.g., I-B) may effectively serve as a supplemental barrier layer in addition to the lower layer of the double dielectric layer (e.g., I-A) (e.g., which provides a high barrier for diffusion of $H_2O$). As a result of the plasma activation process, the double dielectric layer (e.g., I-A and I-B) may have the reduced first thickness or the reduced second thickness (e.g., T1'/T2'<T1/T2), and the plasma activated layer (e.g., I-B') may have the third thickness or the fourth thickness (e.g., t1/t2), as described above. After the plasma activation process, and in an embodiment of block 125, plasma activated layers (e.g., I-B') of respective ones of the first device component (e.g., A) and the second device component (e.g., B) may be brought into contact with each other to facilitate the bonding process.

In still another embodiment of block 110, FIG. 2E illustrates an example where the insulation layers (e.g., I1 or I2) include a triple dielectric layer (e.g., I-A, I-B, and I-C). The triple dielectric layer (e.g., I-A, I-B, and I-C) may have the first thickness (e.g., T1) or the second thickness (e.g., T2), as described above. In some embodiments, the bottom layer of the triple dielectric layer (e.g., I-A) and the middle layer of the triple dielectric layer (e.g., I-C) are composed of a material that includes silicon and nitrogen (e.g., such as silicon nitride (SiN)) or silicon, nitrogen, and carbon (e.g., such as silicon carbonitride (SiCN)), and the upper layer of the triple dielectric layer (e.g., I-B) is composed of a material that includes silicon and oxygen (e.g., such as silicon dioxide ($SiO_2$)) or silicon, oxygen, and nitrogen (e.g., such as silicon oxynitride (SiON)). In some embodiments, the bottom layer of the triple dielectric layer (e.g., I-A) and the middle layer of the triple dielectric layer (e.g., I-C) are composed of a same material (e.g., both the bottom layer and the middle layer include SiN, or both the bottom layer and the middle layer include SiCN). In some examples, the bottom layer of the triple dielectric layer (e.g., I-A) and the middle layer of the triple dielectric layer (e.g., I-C) are composed of different materials (e.g., the bottom layer includes SiN and the middle layer includes SiCN, or vice versa). As shown in the example of FIG. 2E, the bottom layer of the triple dielectric layer (e.g., I-A) is formed directly over the underlying superlattice structure or CFET channel layer disposed within the first device component (e.g., A) or the second device component (e.g., B), thereby protecting the underlying superlattice structure or CFET channel layer from $H_2O$ induced oxidation. The middle layer of the triple dielectric layer (e.g., I-C) is formed over the bottom layer of the triple dielectric layer (e.g., I-A), thereby providing an additional layer of protection for the underlying superlattice structure or CFET channel layer from $H_2O$ induced oxidation. As also shown in FIG. 2E, the upper layer of the triple dielectric layer (e.g., I-B) is formed over the middle layer of the triple dielectric layer (e.g., I-C). In this example, the bottom layer of the triple dielectric layer (e.g., I-A) may serve as a first dedicated barrier layer, the middle layer of the triple dielectric layer (e.g., I-C) may serve as a second dedicated barrier layer, and the upper layer of the triple dielectric layer (e.g., I-B) may provide the bonding layer.

Continuing with the example of FIG. 2E, and in an embodiment of block 120, the plasma activation process exposes the upper layer of the triple dielectric layer (e.g., I-B) to a plasma to modify surface conditions of the upper layer of the triple dielectric layer (e.g., I-B). The plasma activation process forms a plasma activated layer (e.g., I-B') having a plasma activated surface (e.g., S1'/S2') within an upper portion of the upper layer of the triple dielectric layer (e.g., I-B), where the plasma activated layer (e.g., I-B') is disposed over a lower portion of the upper layer of the triple dielectric layer (e.g., I-B) that remains untreated by the plasma activation process, and where the untreated lower portion of the upper layer of the triple dielectric layer (e.g., I-B) interposes the middle layer of the triple dielectric layer (e.g., I-C) and the plasma activated layer (e.g., I-B'). The plasma activated surface (e.g., S1'/S2') promotes and/or enhances chemical bonding between the first and second insulation layers compared to the bonding surfaces (e.g., S1/S2) before the plasma activation process. In the present example, the plasma activated surface (e.g., S1'/S2') includes $OH^-$ dangling bonds. In some cases, the plasma activated layer (e.g., I-B') may include $SiO_2$ having $OH^-$ dangling bonds. In some embodiments, the untreated lower portion of the upper layer of the triple dielectric layer (e.g., I-B) includes $SiO_2$ or SiON. In some examples, and after the plasma activation process, the plasma activated layer (e.g., I-B') may be referred to as a bonding portion of the bonding layer. In some cases, the untreated lower portion of the upper layer of the triple dielectric layer (e.g., I-B) may effectively serve as a supplemental barrier layer in addition to the bottom layer of the triple dielectric layer (e.g., I-A) and the middle layer of the triple dielectric layer (e.g., I-C) (e.g., which both provide a high barrier for diffusion of $H_2O$). As a result of the plasma activation process, the triple dielectric layer (e.g., I-A, I-B, and I-C) may have the reduced first thickness or the reduced second thickness (e.g., T1'/T2'<T1/T2), and the plasma activated layer (e.g., I-B') may have the third thickness or the fourth thickness (e.g., t1/t2), as described above. After the plasma activation process, and in an embodiment of block 125, plasma activated layers (e.g., I-B') of respective ones of the first device component (e.g., A) and the second device component (e.g., B) may be brought into contact with each other to facilitate the bonding process.

Method 100 provides a stacked device structure (e.g., SS1) that includes the first device component (e.g., A), the second device component (e.g., B), and the bonding/insulation layer (e.g., BL1) between the first device component and the second device component. The bonding/insulation layer includes the first insulation layer (e.g., I1), the second insulation layer (e.g., I2), and the plasma activated layer (e.g., PL) therebetween. In various embodiments, each of the first insulation layer (e.g., I1) and the second insulation layer (e.g., I2) may be composed of a single dielectric layer (e.g., FIG. 2C) or a plurality of dielectric layers, such as a double dielectric layer (e.g., FIG. 2D) or a triple dielectric layer (e.g., FIG. 2E). In embodiments where the stacked device structure is provided for monolithically fabricating a stacked transistor, the first device component is a first precursor for fabricating a first transistor, and the second device component is a second precursor for fabricating a second transistor. After bonding, the second precursor and the first precursor may be processed to form the first transistor over the second transistor, respectively, and the bonding/insulation layer will provide an isolation structure, such as isolation structure 17A of isolation structure 16A, between the first transistor and the second transistor. In embodiments where the stacked device structure is provided for sequentially fabricating a stacked transistor, the first device component is a first transistor, and the second device component is a precursor for fabricating a second transistor. After bonding, the second precursor may be processed to form the second transistor over the first transistor, and the bonding/insulation layer will provide an isolation structure, such as isolation structure 17B of isolation structure 16B, between the first transistor and the second transistor.

Figure 3:
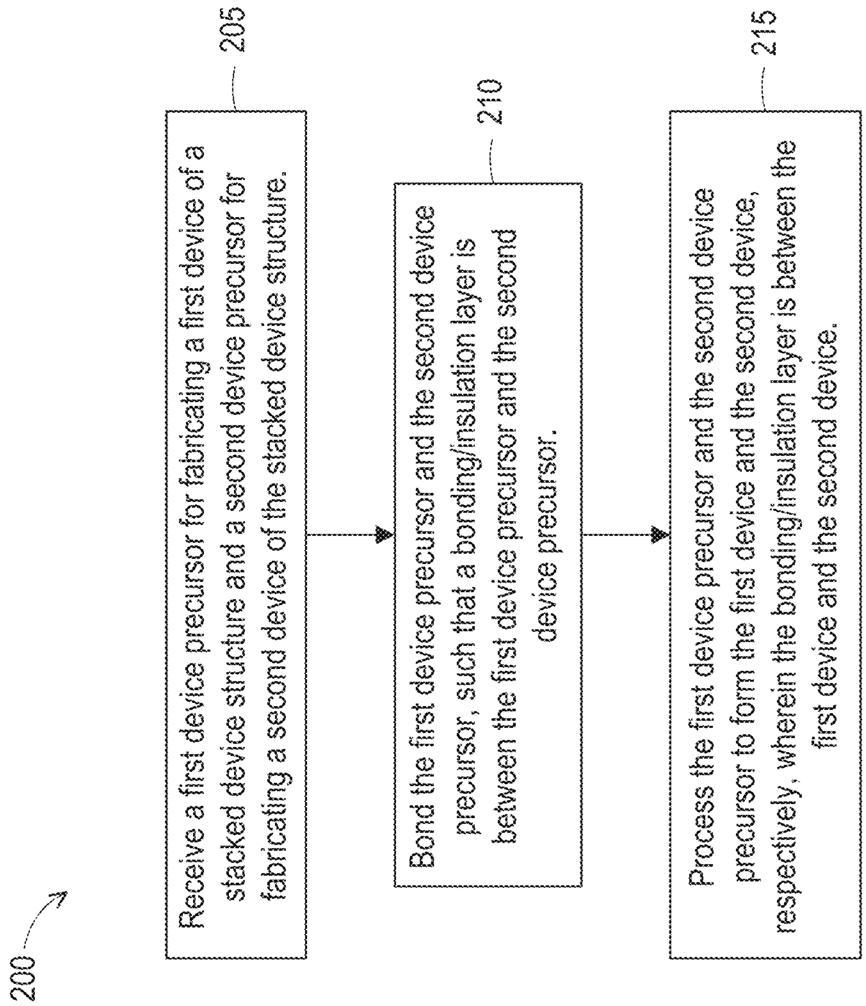
FIG. 3 is a flow chart of a method for monolithically fabricating a stacked device structure, such as the stacked device structure of FIG. 1A, that implements the bonding methods of FIGS. 2A-2E, according to various aspects of the present disclosure.

FIG. 3 is a flow chart of a method 200 for monolithically fabricating a stacked device structure, such as stacked device structure 10A of FIG. 1A, that implements the bonding techniques of FIGS. 2A-2E, according to various aspects of the present disclosure. In FIG. 3, method 200 at block 205 includes receiving a first device precursor for fabricating a first device (e.g., device 12L) of a stacked device structure and receiving a second device precursor for fabricating a second device (e.g., device 12U) of the stacked device structure. Method 200 may proceed to block 210, which includes bonding the first device precursor and the second device precursor. For example, method 100 of FIG. 2A is implemented at block 210 to bond the first device precursor and the second device precursor. After bonding at block 210, a bonding/insulation layer is between the first device precursor and the second device precursor. From block 210, method 200 proceeds to processing the first device precursor and the second device precursor to form the first device and the second device, respectively, at block 215. The second device is over the first device. After processing, the bonding/insulation layer between the first device and the second device may provide isolation structure 17A therebetween, as discussed above with reference to the monolithically fabricated stacked device structure 10A. FIG. 3 has been simplified for the sake of clarity to better understand the inventive concepts of the present disclosure. Additional steps may be provided before, during, and after method 200, and some of the steps described may be moved, replaced, or eliminated for additional embodiments of method 200.

FIGS. 4A-4J are cross-sectional views of stacked device structure 10A, in portion or entirety, at various monolithic fabrication stages, such as those associated with method 200 of FIG. 3 when implementing a bonding technique (e.g., block 210 of method 200), such as that described with reference to FIGS. 2A-2E, according to various aspects of the present disclosure. FIGS. 4A-4J have been simplified for the sake of clarity to better understand the inventive concepts of the present disclosure. Additional steps may be provided before, during, and after the monolithic fabrication steps of FIGS. 4A-4J, and some of the steps described may be moved, replaced, or eliminated for additional embodiments of the monolithic fabrication steps of FIGS. 4A-4J. Additional features may be added in stacked device structure 10A of FIGS. 4A-4J, and some of the features described below may be replaced, modified, or eliminated in other embodiments of stacked device structure 10A of FIGS. 4A-4J.

Figure 4A:
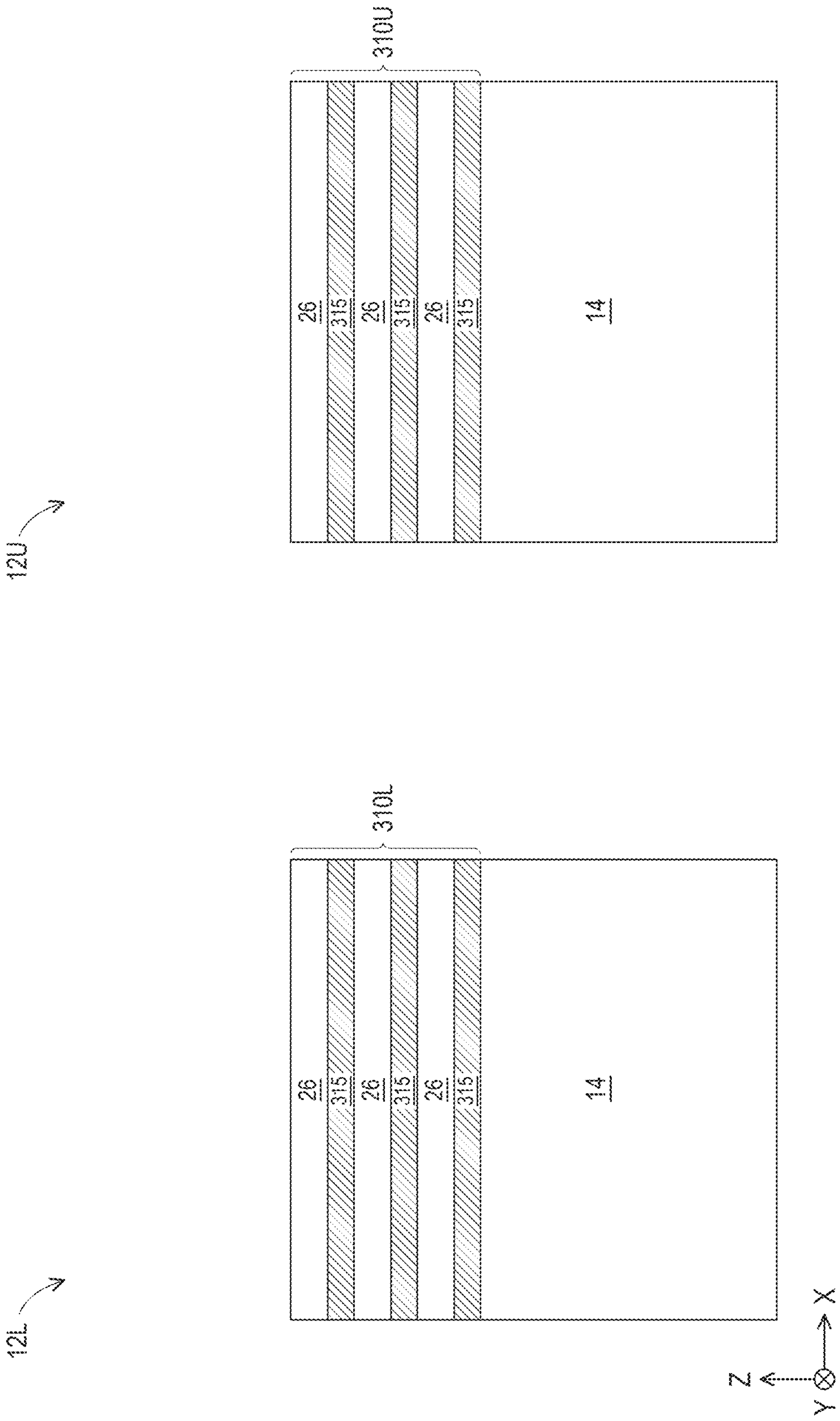
FIGS. 4A, 4B, 4C, 4D, 4E, 4F, 4G, 4H, 4I, and 4J are cross-sectional views of a stacked device structure, in portion or entirety, at various fabrication stages, such as those associated with the methods of FIG. 3 and FIGS. 2A-2E, according to various aspects of the present disclosure.

Referring to FIG. 4A, fabricating stacked device structure 10A includes receiving a device precursor for device 12L and a device precursor for device 12U. The device precursor for device 12L includes a semiconductor layer stack 310L disposed over a respective substrate 14, and the device precursor for device 12U includes a semiconductor layer stack 310U disposed over a respective substrate 14. Semiconductor layer stack 310L and semiconductor layer stack 310U each include respective semiconductor layers 26 and respective semiconductor layers 315. Semiconductor layers 315 and semiconductor layers 26 are stacked vertically (e.g., along the z-direction) in an interleaving and/or alternating configuration from a top surface of substrate 14. A composition of semiconductor layers 315 and a composition of semiconductor layers 26 are different to achieve etching selectivity and/or different oxidation rates during processing. For example, semiconductor layers 315 and semiconductor layers 26 include different materials, constituent atomic percentages, constituent weight percentages, thicknesses, other characteristics, or a combination thereof to achieve desired etching selectivity. In the depicted embodiment, semiconductor layers 26 include silicon, and semiconductor layers 315 include silicon germanium. With such compositions, semiconductor layers 315 may have a first etch rate to an etchant, semiconductor layers 26 may have a second etch rate to the etchant, and the first etch rate and the second etch rate are different. In some embodiments, semiconductor layers 315 and/or semiconductor layers 26 include n-type dopants and/or p-type dopants. The present disclosure contemplates semiconductor layers 315 and semiconductor layers 26 having any combination of semiconductor materials that provide desired etching selectivity and/or desired performance characteristics (e.g., materials that maximize current flow).

Figure 4B:
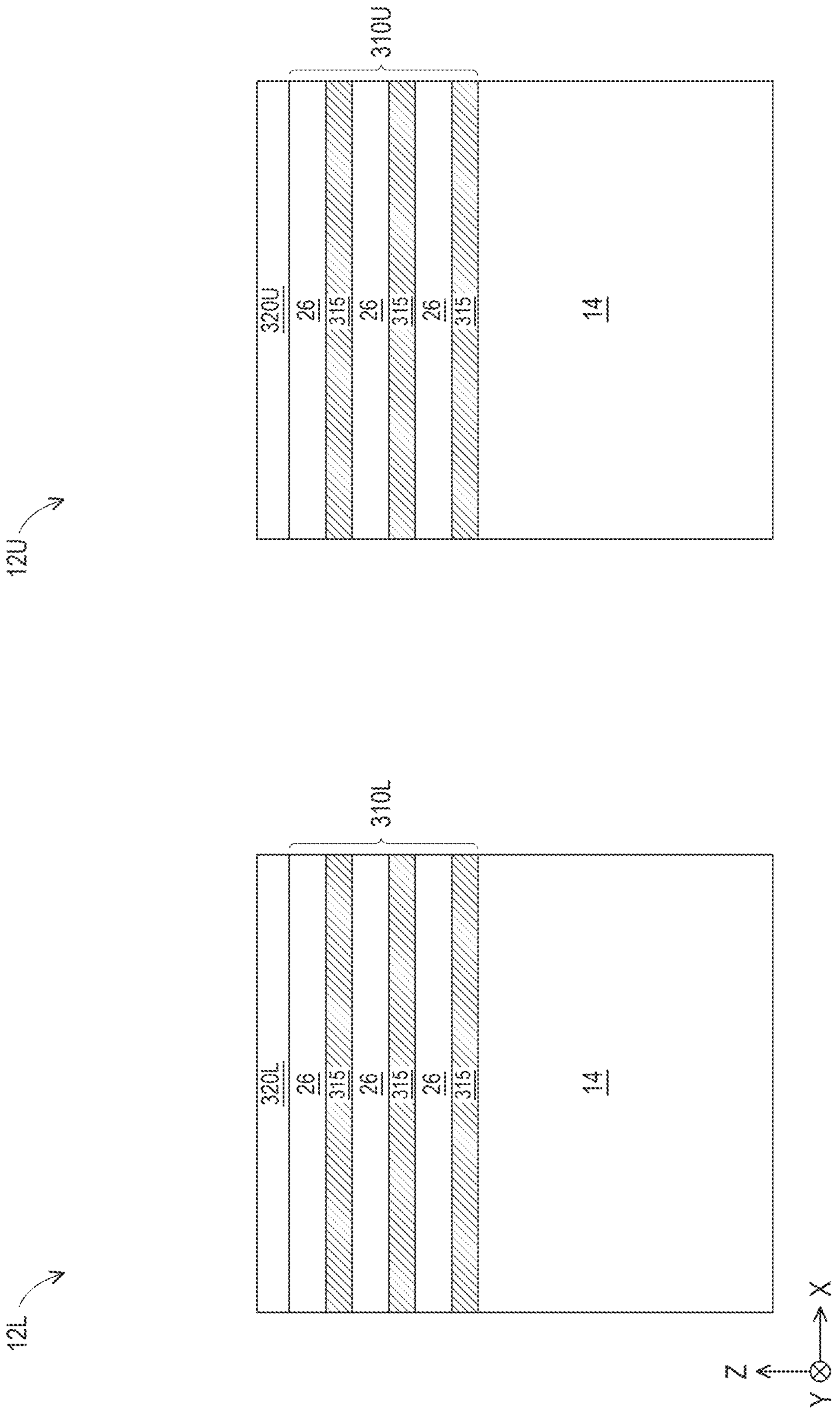
Figure 4C:
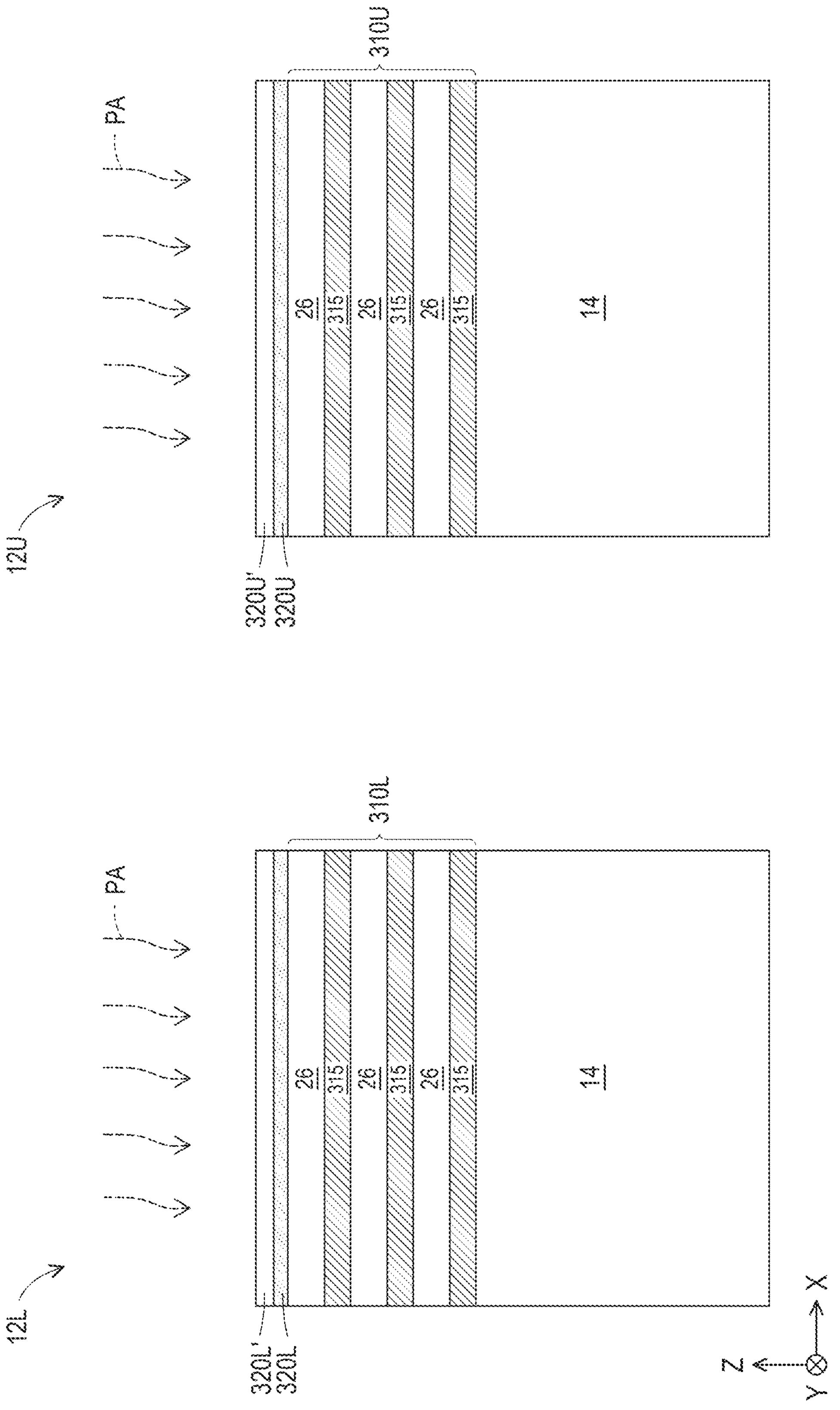
Figure 4E:
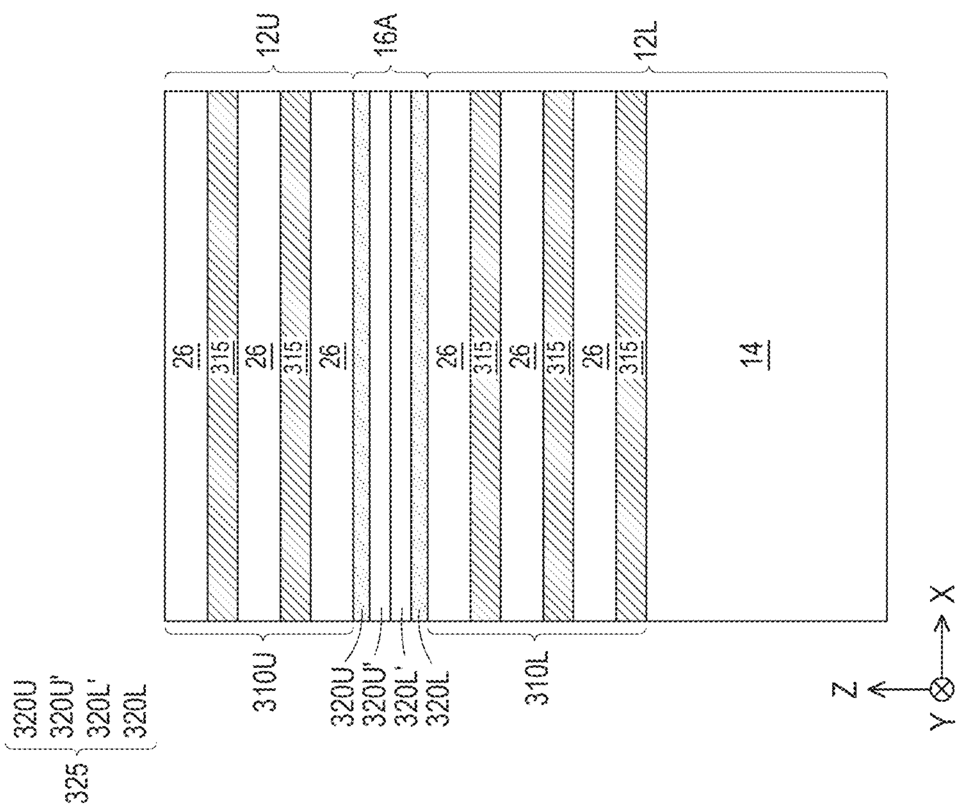
Figure 4D:
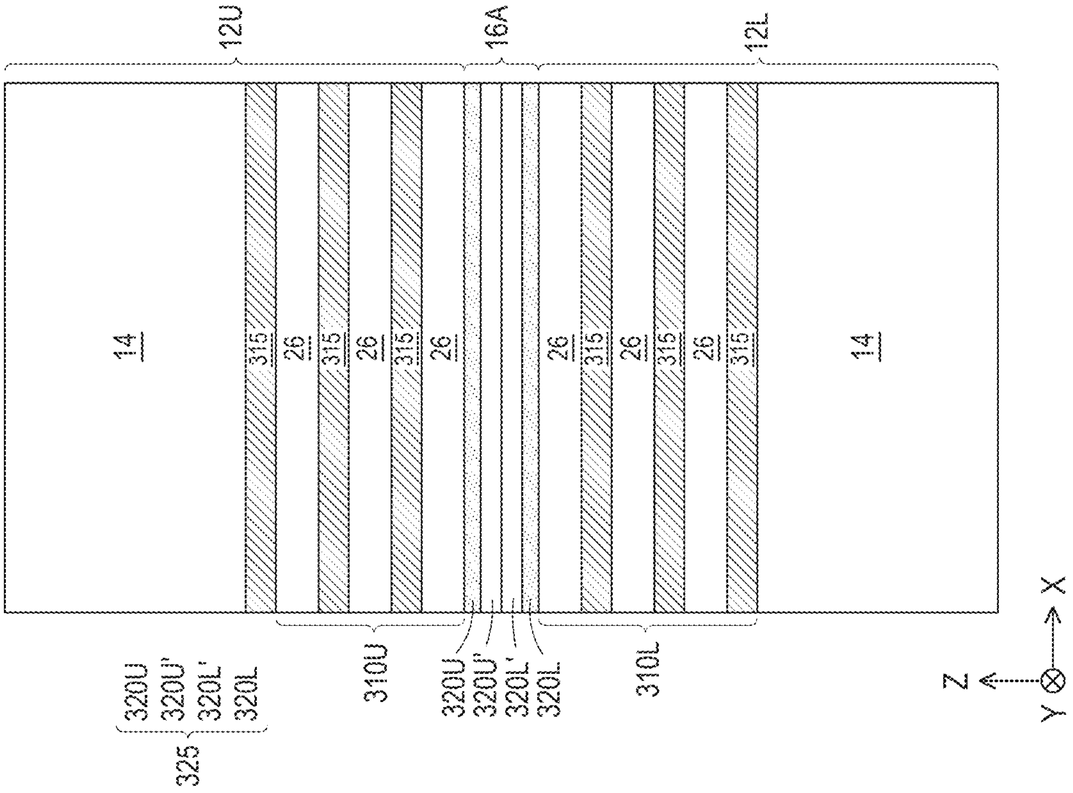

Referring to FIGS. 4B-4D, fabricating stacked device structure 10A includes bonding the device precursor for device 12L and the device precursor for device 12U. In FIG. 4B, an insulation/bonding layer 320L is formed over semiconductor layer stack 310L, and an insulation/bonding layer 320U is formed over semiconductor layer stack 310U. Insulation layer 320L and insulation layer 320U may include a same material. In an example, insulation layer 320L and insulation layer 320U may be similar to insulation layer I1 and insulation layer I2, respectively, described above with reference to FIGS. 2A-2E. For example, in some embodiments, insulation layer 320L and insulation layer 320U may include a single dielectric layer (e.g., such as I-A, FIG. 2C) composed of a material that includes silicon and nitrogen (e.g., SiN) or silicon, nitrogen, and carbon (e.g., SiCN). In some cases, insulation layer 320L and insulation layer 320U may include a double dielectric layer (e.g., such as I-A and I-B, FIG. 2D), where the lower layer of the double dielectric layer (e.g., I-A) is composed of a material that includes silicon and nitrogen (e.g., SiN) or silicon, nitrogen, and carbon (e.g., SiCN), and the upper layer of the double dielectric layer (e.g., I-B) is composed of a material that includes silicon and oxygen (e.g., $SiO_2$) or silicon, oxygen, and nitrogen (e.g., SiON). In yet other embodiments, insulation layer 320L and insulation layer 320U may include a triple dielectric layer (e.g., such as I-A, I-B, and I-C, FIG. 2E, where the bottom layer of the triple dielectric layer (e.g., I-A) and the middle layer of the triple dielectric layer (e.g., I-C) are composed of a material that includes silicon and nitrogen (e.g., SiN) or silicon, nitrogen, and carbon (e.g., SiCN), and the upper layer of the triple dielectric layer (e.g., I-B) is composed of a material that includes silicon and oxygen (e.g., $SiO_2$) or silicon, oxygen, and nitrogen (e.g., SiON). In embodiments including the triple dielectric layer, the bottom layer of the triple dielectric layer (e.g., I-A) and the middle layer of the triple dielectric layer (e.g., I-C) may be composed of a same material (e.g., both the bottom layer and the middle layer include SiN, or both the bottom layer and the middle layer include SiCN). Alternatively, in embodiments including the triple dielectric layer, the bottom layer of the triple dielectric layer (e.g., I-A) and the middle layer of the triple dielectric layer (e.g., I-C) may be composed of different materials (e.g., the bottom layer includes SiN and the middle layer includes SiCN, or vice versa). Insulation layer 320L and insulation layer 320U may have a thickness that is in a range of between about 1-100 nm. In other embodiments, insulation layer 320L and insulation layer 320U may have a thickness that is about 5 nm to about 25 nm. Insulation layer 320L and insulation layer 320U may be formed by CVD, PECVD, ALD, PEALD, PVD, other suitable process, or a combination thereof.

In FIG. 4C, a shallow plasma activation process (PA) is performed on insulation layer 320L and insulation layer

320U. The shallow plasma activation process is similar to the plasma activation process described above with reference to FIGS. 2A-2E. Generally, the shallow plasma activation process may modify characteristics of portions of insulation layer 320L and insulation layer 320U, thereby providing a plasma activated portion 320L' and a plasma activated portion 320U', respectively. In some embodiments, each of the plasma activated portion 320L' and the plasma activated portion 320U' may have a thickness that is less than about 5 nm.

For embodiments in which the insulation layer 320L and insulation layer 320U include a single dielectric layer (e.g., such as I-A, FIG. 2C), the shallow plasma activation process may modify surface conditions of the single dielectric layer (e.g., I-A) to form a plasma activated layer (e.g., I-A') within an upper portion of the single dielectric layer (e.g., I-A), where the plasma activated layer (e.g., I-A') is disposed over a lower portion of the single dielectric layer (e.g., I-A) that remains untreated by the shallow plasma activation process. Thus, in embodiments including the single dielectric layer, the plasma activated portions 320L', 320U' may include the plasma activated layer (e.g., I-A'), and the non-plasma treated portions of insulation layer 320L and insulation layer 320U may include the non-plasma treated lower portion of the single dielectric layer (e.g., I-A).

For embodiments in which the insulation layer 320L and insulation layer 320U include a double dielectric layer (e.g., such as I-A and I-B, FIG. 2D), the shallow plasma activation process may modify surface conditions of the upper layer of the double dielectric layer (e.g., I-B) to form a plasma activated layer (e.g., I-B') within an upper portion of the upper layer of the double dielectric layer (e.g., I-B), where the plasma activated layer (e.g., I-B') is disposed over a lower portion of the upper layer of the double dielectric layer (e.g., I-B) that remains untreated by the plasma activation process, and where the untreated lower portion of the upper layer of the double dielectric layer (e.g., I-B) interposes the lower layer of the double dielectric layer (e.g., I-A) and the plasma activated layer (e.g., I-B'). Thus, in embodiments including the double dielectric layer, the plasma activated portions 320L', 320U' may include the plasma activated layer (e.g., I-B'), and the non-plasma treated portions of insulation layer 320L and insulation layer 320U may include the non-plasma treated lower portion of the upper layer of the double dielectric layer (e.g., I-B) and the lower layer of the double dielectric layer (e.g., I-A).

For embodiments in which the insulation layer 320L and insulation layer 320U include a triple dielectric layer (e.g., such as I-A, I-B, and I-C, FIG. 2E), the shallow plasma activation process may modify surface conditions of the upper layer of the triple dielectric layer (e.g., I-B) to form a plasma activated layer (e.g., I-B') within an upper portion of the upper layer of the triple dielectric layer (e.g., I-B), where the plasma activated layer (e.g., I-B') is disposed over a lower portion of the upper layer of the triple dielectric layer (e.g., I-B) that remains untreated by the plasma activation process, and where the untreated lower portion of the upper layer of the triple dielectric layer (e.g., I-B) interposes the middle layer of the triple dielectric layer (e.g., I-C) and the plasma activated layer (e.g., I-B'). Thus, in embodiments including the triple dielectric layer, the plasma activated portions 320L', 320U' may include the plasma activated layer (e.g., I-B'), and the non-plasma treated portions of insulation layer 320L and insulation layer 320U may include the non-plasma treated lower portion of the upper layer of the triple dielectric layer (e.g., I-B), the middle layer of the triple dielectric layer (e.g., I-C), and the lower layer of the triple dielectric layer (e.g., I-A).

Parameters of the shallow plasma activation process may be tuned to enhance promote and/or enhance bonding between insulation layer 320L and insulation layer 320U by causing OH groups to form on top, bonding surfaces thereof. The shallow plasma activation process may thus be used to form hydroxides on top surfaces of the insulation layer 320L and insulation layer 320U. In some embodiments, the shallow plasma activation process is an oxygen plasma treatment, an oxygen-hydrogen plasma treatment, or other suitable plasma treatment. In some embodiments, the shallow plasma activation process may be performed at a temperature of less than about 400 degrees Celsius. In some cases, a cleaning process may be performed (e.g., to top surfaces of the insulation layers 320L, 320U before plasma activation, to top surfaces the plasma activated portions 320L', 320U' after plasma activation, or a combination thereof). Such a cleaning process may be performed using an RCA cleaning process including an SC-1 clean (ammonium hydroxide, hydrogen peroxide, and water) and/or an SC-2 clean (hydrochloric acid, hydrogen peroxide, and water). In some examples, the cleaning process may additionally or alternatively include a DI rinse applied to the plasma activated portion 320L' and/or the plasma activated portion 320U'.

In FIG. 4D, the device precursor of device 12U (e.g., a backside thereof) is attached and/or bonded to the device precursor of device 12L (e.g., a frontside thereof). The attaching/bonding may include flipping over the device precursor of device 12U, aligning the device precursor of device 12U with the device precursor of device 12L, contacting the device precursor of device 12U to the device precursor of device 12L, and performing an annealing process, thereby providing a stacked device structure. For example, plasma activated portion 320U' is brought into contact with plasma activated portion 320L' (or vice versa) under a temperature, a pressure, an atmosphere, or a combination thereof for a time that effectuates bonding of plasma activated portion 320U' and plasma activated portion 320L'. Surface $OH^-$ groups of plasma activated portion 320U' and plasma activated portion 320L' enhance and/or improve bonding therebetween. After bonding, the device precursor of device 12L is attached to and electrically isolated from the device precursor of device 12U by an insulation/bonding layer 325, which includes insulation layer 320L, plasma activated portion 320L', insulation layer 320U, and plasma activated portion 320U'. Accordingly, at this stage of processing, insulation/bonding layer 325 provides isolation structure 16A of stacked device structure 10A, which electrically isolates and separates device 12L and device 12U. In some embodiments, a thickness of insulation/bonding layer 325 is about 1-100 nm. In some cases, the thickness of insulation/bonding layer 325 is about 10 nm to about 50 nm. In some embodiments, plasma activated portion 320U' and plasma activated portion 320L' are bonded using dielectric-to-dielectric bonding. In some embodiments, the bonding includes performing an annealing process, after contacting the device precursor of device 12U to the device precursor of device 12L, to effectuate bonding of plasma activated portion 320U' and plasma activated portion 320L'. In some examples, the annealing process serves to effectuate bonding of the device precursor of device 12L to the device precursor of device 12U by forming bonds between the plasma activated portions 320L', 320U' (e.g., such as Si—C—Si bonds and/or Si—O—Si bonds). The annealing process, in some cases, may also serve to cause dehydration (e.g., of $H_2O$).

In embodiments where the insulation layer 320L and insulation layer 320U include a single dielectric layer (e.g., such as I-A, FIG. 2C), the insulation/bonding layer 325 includes the insulation layers 320L, 320U (each including a non-plasma treated lower portion of the single dielectric layer (e.g., I-A)) and the plasma activated portions 320L', 320U' (each including the plasma activated layer (e.g., I-A')). In embodiments where the insulation layer 320L and insulation layer 320U include a double dielectric layer (e.g., such as I-A and I-B, FIG. 2D), the insulation/bonding layer 325 includes the insulation layers 320L, 320U (each including a non-plasma treated lower portion of the upper layer of the double dielectric layer (e.g., I-B) and a lower layer of the double dielectric layer (e.g., I-A)) and the plasma activated portions 320L', 320U' (each including the plasma activated layer (e.g., I-B'). In embodiments where the insulation layer 320L and insulation layer 320U include a triple dielectric layer (e.g., such as I-A, I-B, and I-C, FIG. 2E), the insulation/bonding layer 325 includes the insulation layers 320L, 320U (each including a non-plasma treated lower portion of the upper layer of the triple dielectric layer (e.g., I-B), a middle layer of the triple dielectric layer (e.g., I-C), and a lower layer of the triple dielectric layer (e.g., I-A)) and the plasma activated portions 320L', 320U' (each including the plasma activated layer (e.g., I-B').

Referring to FIG. 4E, a thinning process may be performed to remove substrate 14 from the device precursor of device 12U. For example, a planarization process, such as CMP, or an etching process is performed to remove substrate 14. In some embodiments, top semiconductor layer 315 of semiconductor layers stack 310U functions as a planarization/CMP stop layer and/or an etch stop layer, and the planarization process and/or the etching process stops upon reaching top semiconductor layer 315. In such embodiments, thereafter, top semiconductor layer 315 may be removed, for example, by an etching process, to expose top semiconductor layer 26 of semiconductor layer stack 310U. Removing top semiconductor layer 315 provides device 12U with a top semiconductor layer 26, which will provide a top channel of device 12U as described herein. In some embodiments, top semiconductor layer 26 of semiconductor layer stack 310U functions as a planarization/CMP stop layer and/or an etch stop layer, and the planarization process and/or the etching process also removes substrate 14 and top semiconductor layer 315 of semiconductor layer stack 310U. In some embodiments, a combination of etching and polishing/planarization is implemented to remove substrate 14 and/or top semiconductor layer 315. Other methods and/or techniques for removing substrate 14 and/or top semiconductor layer 315 are contemplated. In some embodiments, a de-bonding process may be performed before or concurrently with the thinning process to remove a carrier wafer attached to substrate 14 of the device precursor of device 12U before bonding.

Figure 4F:
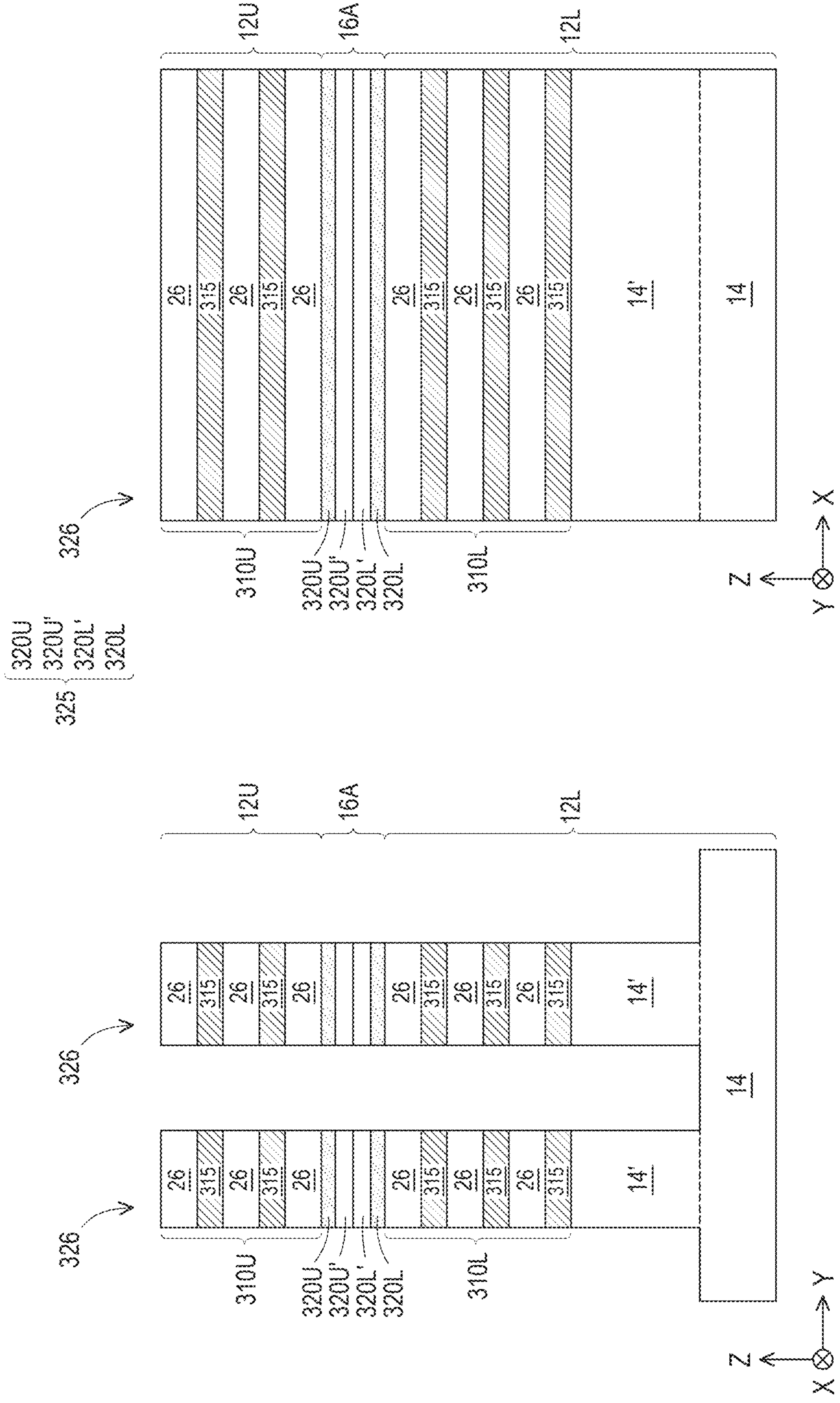

Referring to FIGS. 4F-4J, fabricating stacked device structure 10A includes processing the device precursors to form device 12L and device 12U. In FIG. 4F, a fin fabrication process is performed to form fins 326 (also referred to as fin structures, fin elements, etc.) extending from substrate 14. Fins 326 extend substantially parallel to one another along an x-direction, having a length in the x-direction, a width in a y-direction, and a height in a z-direction. Each of fins 326 include a substrate portion (e.g., a respective mesa 14'), a first semiconductor layer stack portion disposed over the substrate portion (e.g., a respective portion of semiconductor layer stack 310L), an isolation portion disposed over the first semiconductor layer stack portion (e.g., a respective portion of insulation/bonding layer 325), and a second semiconductor layer stack portion (e.g., a respective portion of semiconductor layer stack 310U) disposed over the isolation portion. Fabrication of fins 326 may include performing a lithography process and/or etching process to pattern a semiconductor layer stack precursor (e.g., semiconductor layer stack 310U and semiconductor layer stack 310L separated by insulation layer 325) and/or substrate 14. In some embodiments, fins 326 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or a combination thereof), a triple patterning process (for example, a lithography-etch-lithography-etch-lithography-etch (LELELE) process, a self-aligned triple patterning (SATP) process, other triple patterning process, or a combination thereof), other multiple patterning process (for example, a self-aligned quadruple patterning (SAQP) process), or a combination thereof.

Figure 4G:
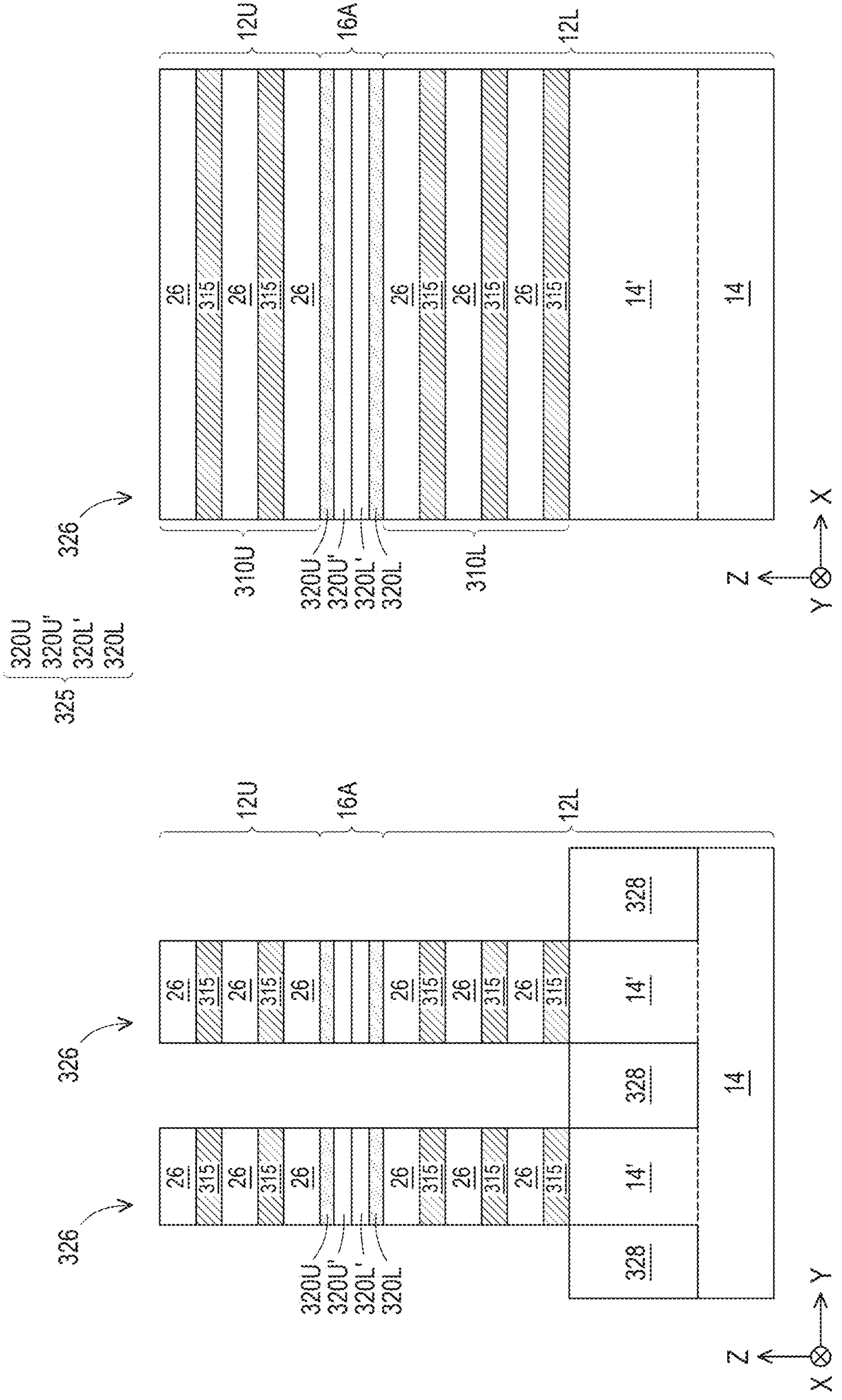

In FIG. 4G, fabricating stacked device structure 10A includes forming substrate isolation structures 328 in trenches between fins 326. Substrate isolation structures 328 fill lower portions of the trenches and surround portions of fins 326. Portions of fins 326 that extend above top surfaces of substrate isolation structures 328 may be referred to as fin active regions. Substrate isolation structures 328 electrically isolate active device regions and/or passive device regions. Substrate isolation structures 328 include silicon oxide, silicon nitride, silicon oxynitride, other suitable isolation material (e.g., including silicon, oxygen, nitrogen, carbon, etc.), or a combination thereof. Substrate isolation structures 328 may have a multilayer structure. For example, substrate isolation structures 328 may include a bulk dielectric (e.g., an oxide layer) over a dielectric liner (e.g., silicon nitride, silicon oxide, silicon oxynitride, silicon oxycarbonitride, or a combination thereof). In another example, substrate isolation structures 328 may include a bulk dielectric over a doped liner, such as a boron BSG liner and/or a PSG liner. Dimensions and/or characteristics of substrate isolation structures 328 are configured to provide shallow trench isolation (STI) structures, deep trench isolation (DTI) structures, local oxidation of silicon (LOCOS) structures, other suitable isolation structures, or a combination thereof. In the depicted embodiment, substrate isolation structures 328 may be STI structures.

Substrate isolation structures 328 may be formed by depositing a liner layer (e.g., a dielectric layer) that partially fills the trenches, depositing an oxide material over the liner layer that fills remainders of the trenches, performing a planarization process, and recessing and/or etching back substrate isolation structures 328, such that fins 326 protrude therefrom. The planarization process (e.g., CMP) may be performed until reaching and exposing a planarization stop layer. In some embodiments, the planarization process removes mask layers, any of the liner layer, any of the oxide material, any of the liner layer, or a combination thereof that are above and/or over top surfaces of fins 326. Remainders of the liner layer and the oxide material may form liners and bulk dielectrics, respectively, of substrate isolation structures 328.

Figure 4I:
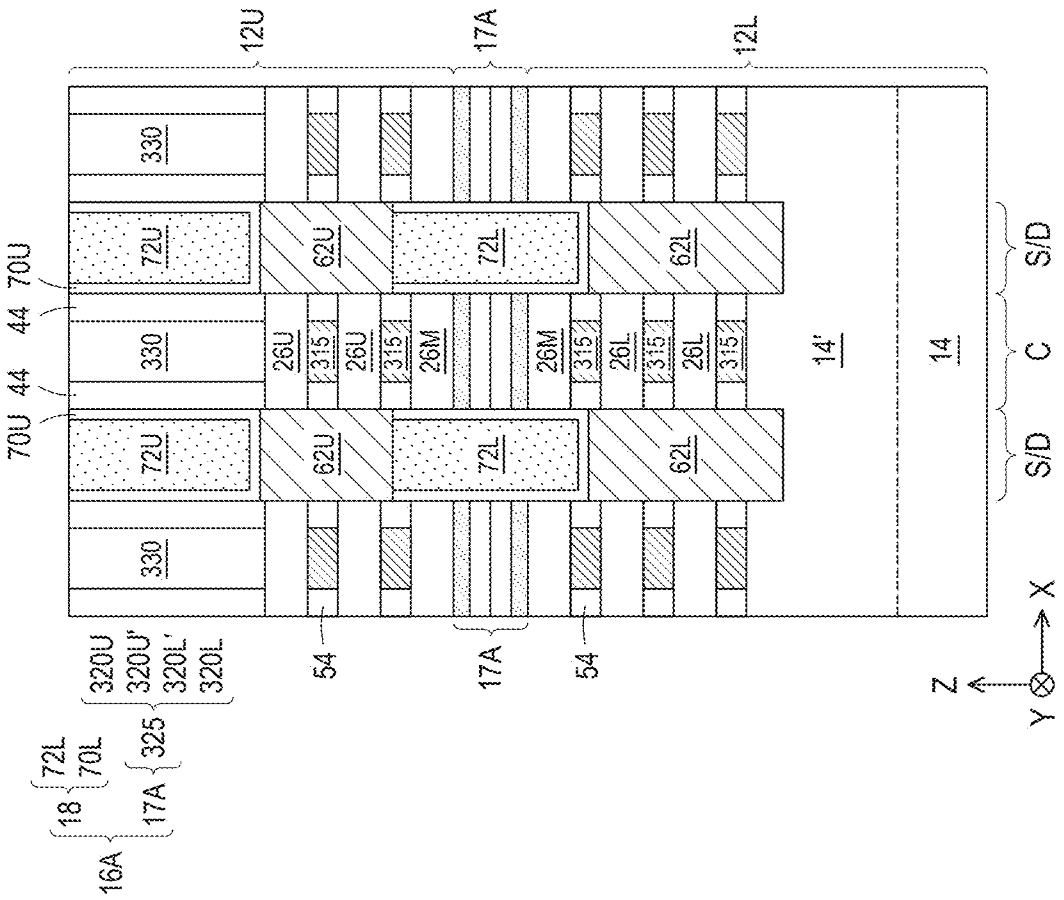
Figure 4H:
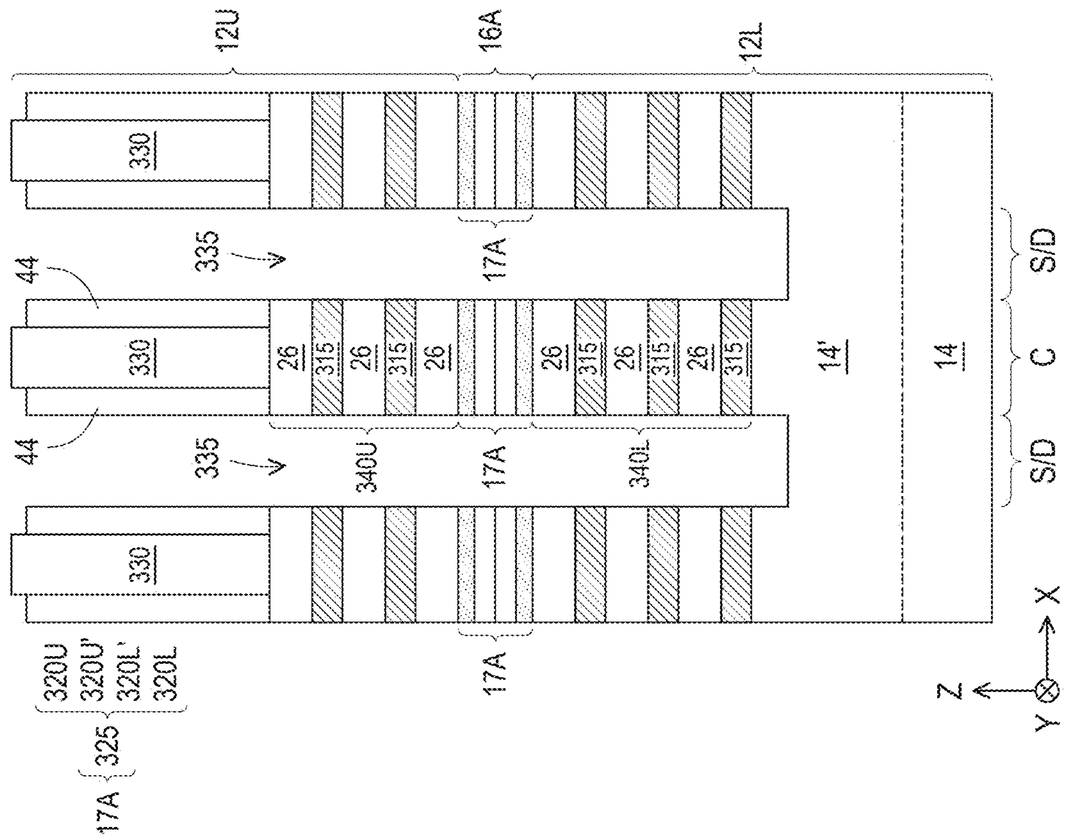

In FIG. 4H, fabricating stacked device structure 10A includes forming dummy gate stacks 330 over portions of fins 326, forming gate spacers 44 along sidewalls of dummy gate stacks 330, and forming source/drain recesses 335. Dummy gate stacks 330 extend lengthwise in a direction that is different than (e.g., orthogonal to) the lengthwise direction of fins 326. For example, dummy gate stacks 330 extend along the y-direction, having a length in the y-direction, a width in the x-direction, and a height in the z-direction. In the X-Z plane, dummy gate stacks 330 are disposed over tops of channel regions (C) of fins 326 and/or stacked device structure 10A, and dummy gate stacks 330 are disposed between source/drain regions (S/D) of fins 326 and/or stacked device structure 10A. In the Y-Z plane, dummy gate stacks 330 may be disposed on tops and sidewalls of fins 326, and dummy gate stacks 330 may wrap channel regions. Dummy gate stacks 330 may include a dummy gate dielectric, a dummy gate electrode, a hard mask, other suitable layers (e.g., a capping layer, an interface layer, a diffusion layer, a barrier layer, etc.), or a combination thereof. The dummy gate dielectric includes a dielectric material, such as silicon oxide, a high-k dielectric material, other suitable dielectric material, or a combination thereof. The dummy gate electrode includes a suitable dummy gate material, such as polysilicon. The hard mask includes suitable hard mask material, such as silicon nitride.

Source/drain recesses 335 may be formed by performing an etching process that removes semiconductor layer stack 310U, insulation layer 325, and semiconductor layer stack 310L in source/drain regions of fins 326, thereby exposing mesas 14'. The etching process further removes some, but not all, of mesas 14', such that source/drain recesses 335 extend below top surfaces of substrate isolation structures 328. Each source/drain recess 335 has respective sidewalls formed by respective remaining portions of semiconductor layer stack 310U, insulation layer 325, and semiconductor layer stack 310L in channel regions of fins 326 and a bottom formed by a respective mesa 14'. In the depicted embodiment, after forming source/drain recesses 335, each channel region includes an upper channel portion 340U (e.g., formed by a remainder of semiconductor layer stack 310U) and a lower channel portion 340L (e.g., formed by a remainder of semiconductor layer stack 310L) separated by a channel isolation structure (e.g., e.g., isolation structure 17A, which is formed by a remainder of insulation layer 325). In some embodiments, the etching process removes some, but not all, of semiconductor layer stacks 310L, and source/drain recesses 335 have bottoms formed by semiconductor layers 26 or semiconductor layers 315. In some embodiments, the etching process stops at mesas 14', and source/drain recesses 335 do not extend below substrate isolation structures 328. The etching process is a dry etch, a wet etch, other suitable etch, or a combination thereof. In some embodiments, the etching process is a multistep etch process.

In FIG. 4I, fabricating stacked device structure 10A may include forming inner spacers 54 under gate spacers 44 along sidewalls of semiconductor layers 315. Inner spacers 54 replace portions of semiconductor layers 315 under gate spacers 44, separate semiconductor layers 26 from one another, and separate bottom semiconductor layers 26 from mesas 14'. Forming inner spacers 54 may include a first etching process, a deposition process, and a second etching process. The first etching process selectively etches semiconductor layers 315 with negligible etching of semiconductor layers 26 and mesas 14'. The first etching process is configured to laterally etch semiconductor layers 315 to reduce lengths thereof along the x-direction, thereby forming gaps between semiconductor layers 26 and between mesas 14' and semiconductor layers 26 that separate adjacent semiconductor layers 26 and separate mesas 14' and adjacent semiconductor layers 26. In some embodiments, the gaps laterally extend under dummy gate stacks 330. The deposition process forms a spacer layer that at least partially fills (and may completely fill) the gaps, and the second etching process selectively etches the spacer layer with negligible etching of semiconductor layers 26 and mesas 14', such that remainders of the spacer layer form inner spacers 54. In some embodiments, the spacer layer (and thus inner spacers 54) includes a dielectric material that includes silicon, oxygen, carbon, nitrogen, other suitable dielectric constituent, or a combination thereof. For example, the spacer layer is a silicon nitride layer, a silicon carbonitride layer, a silicon oxycarbonitride layer, a silicon oxycarbide layer, or a combination thereof. In some embodiments, fabrication of inner spacers 54 is configured to provide inner spacers 54 with a multilayer structure and/or air gaps.

In FIG. 4I, fabricating stacked device structure 10A may further include forming epitaxial source/drain stacks in source/drain recesses 335 and forming a dielectric layer (e.g., CESL 70U and ILD layer 72U) over the epitaxial source/drain stacks. Each epitaxial source/drain stack includes a respective epitaxial source/drain 62U and a respective epitaxial source/drain 62L separated by a respective source/drain isolation structure, such as isolation structure 18 (e.g., CESL 70L and ILD layer 72L). Epitaxial source/drain stacks may be formed by filling a bottom/lower portion of source/drain recesses 335 with one or more epitaxial semiconductor materials to form epitaxial source/drains 62L adjacent to semiconductor layers 26 of channel portion 340L, filling a middle portion of source/drain recesses 335 with one or more dielectric materials (e.g., CESL 70L and ILD layer 72L) to form isolation structures 18 adjacent to isolation structures 17A (i.e., channel isolation structures), and filling a top/upper portion of source/drain recesses 335 with one or more epitaxial semiconductor materials to form epitaxial source/drains 62U adjacent to semiconductor layers 26 of channel portion 340U. Semiconductor layers 26 extending between epitaxial source/drains 62U may be referred to as upper semiconductor layers 26U, semiconductor layers 26 extending between epitaxial source/drains 62L may be referred to as lower semiconductor layers 26L, and semiconductor layers 26 extending between isolation structures 18 may be referred to as middle semiconductor layers 26M. Epitaxial source/drains 62L and epitaxial source/drains 62U are formed by any suitable epitaxial deposition and/or growth process. Isolation structures 18 may be formed by depositing a CESL over epitaxial source/drains 62L, depositing an ILD layer over the CESL, and etching back the CESL and/or the ILD layer to expose semiconductor layers 26 of channel portion 340U that will provide channels for device 12U (e.g., semiconductor layers 26U).

In the depicted embodiment, isolation structure 16A, which separates and/or electrically isolates device 12L and device 12U, is provided by isolation structures 17A (i.e., channel isolation structures and/or gate isolation structures) and isolation structures 18 (i.e., source/drain isolation structures). Isolation structures 17A are formed by insulation/bonding layer 325, and isolation structures 17A are disposed between isolation structures 18. Isolation structures 18 extend to a distance above a dummy semiconductor layer of channel portion 340U (e.g., semiconductor layer 26M thereof) and a distance below a bottom active semiconductor layer of channel portion 340U (e.g., bottom semiconductor layer 26U thereof), and isolation structures 18 extend to a distance below a dummy semiconductor layer of channel portion 340L (e.g., semiconductor layer 26M thereof) and a distance above a top active semiconductor layer of channel portion 340L (e.g., top semiconductor layer 26L thereof). The present disclosure contemplates other configurations of isolation structures 18, such as where isolation structures 18 are disposed between isolation structures 17A, but not semiconductor layers 26M (i.e., semiconductor layers 26M extend between respective epitaxial source/drains, instead of isolation structures 18).

Figure 4J:
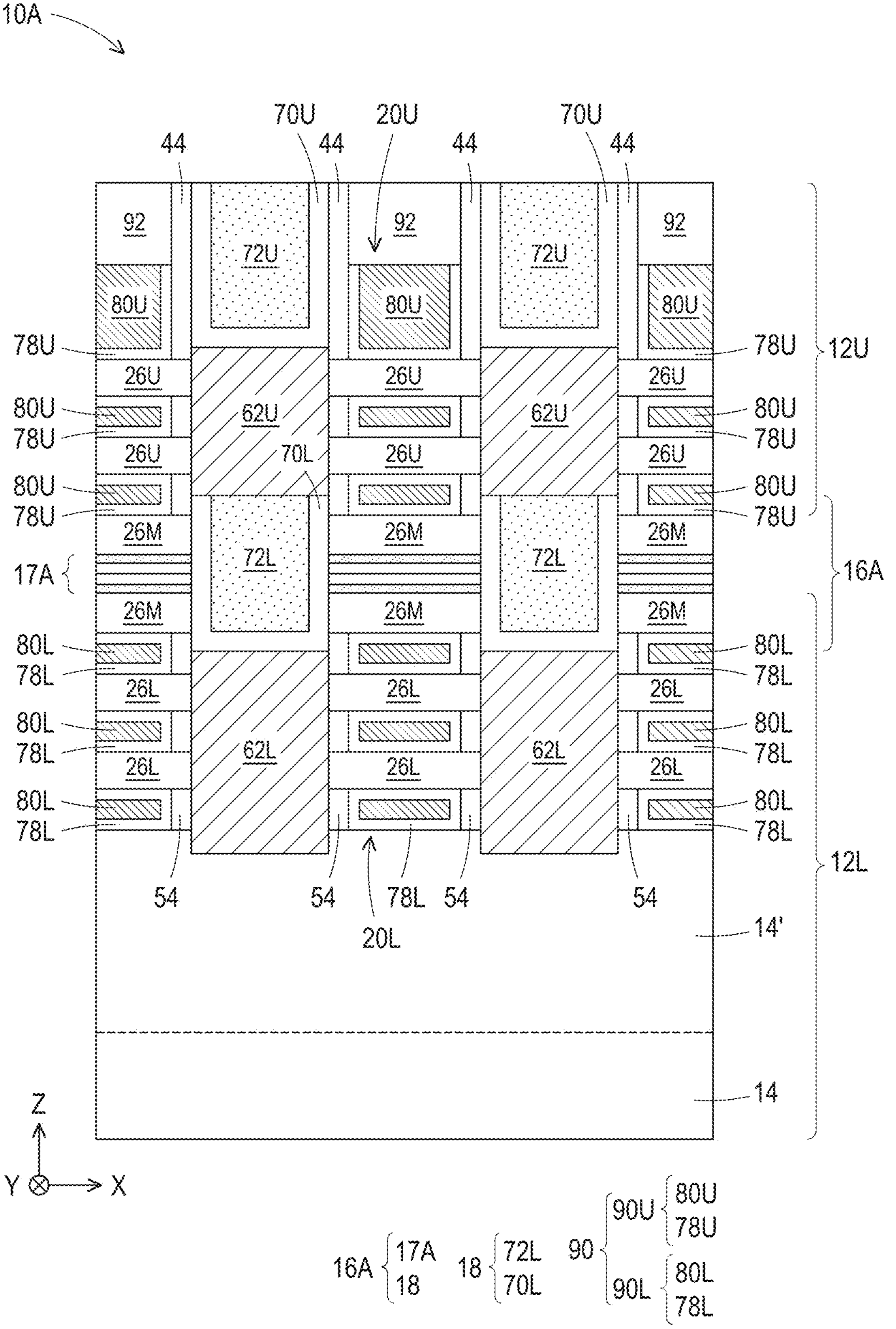

In FIG. 4J, fabricating stacked device structure 10A may include performing a gate replacement process to replace dummy gate stacks 330 with gates and performing a channel release process to form suspended channel layers in channel regions. In some embodiments, fabrication includes removing dummy gate stacks 330 to form gate openings (e.g., by a selective etching process); removing semiconductor layers 315 exposed by the gate openings to form gaps/openings between semiconductor layers 26 and between semiconductor layers 26 and mesas 14' (e.g., by a selective etching process), thereby suspending semiconductor layers 26 over mesas 14'; and forming gates 90 that fill the gate openings and the gaps. Each gate 90 includes a respective gate 90L (e.g., a respective gate dielectric 78L and a respective gate electrode 80L) and a respective gate 90U (e.g., a respective gate dielectric 78U and a respective gate electrode 80U). Gate 90L is separated from gate 90U by middle, dummy semiconductor layers 26M and isolation structure 17A. In some embodiments, gate 90L is separated from gate 90U by isolation structure 17A only. In the depicted embodiment, each channel region has two upper semiconductor layers 26U, which may be referred to as channel layers 26U, and two lower semiconductor layers 26L, which may be referred to as channel layers 26L. Channel layers 26U are vertically stacked along the z-direction and provide two channels for transistor 20U through which current may flow between epitaxial source/drains 62U. Channel layers 26L are vertically stacked along the z-direction and provide two channels for transistor 20L through which current may flow between epitaxial source/drains 62L.

In some embodiments, gates 90U are recessed and/or etched back, such that top surfaces of gates 90U are lower than top surface of ILD layer 72U, and hard masks 92 (which may be referred to as self-aligned contact (SAC) features/structures) are formed over gates 90U. Hard masks 92 include a material that is different than ILD layer 72U and/or subsequently formed ILD layers to achieve etch selectivity during subsequent etching processes. In some embodiments, hard masks 92 include silicon and nitrogen and/or carbon, such as silicon nitride, silicon oxynitride, silicon carbide, silicon oxycarbide, silicon carbonitride, silicon oxycarbonitride, other silicon nitride, other silicon carbide, or a combination thereof. In some embodiments, hard masks 92 include metal and oxygen and/or nitrogen, such as aluminum oxide (e.g., AlO or $Al_2O_3$), aluminum nitride (e.g., AlN), aluminum oxynitride (e.g., AlON), zirconium oxide, zirconium nitride, hafnium oxide (e.g., HfO or $HFO_2$), zirconium aluminum oxide (e.g., ZrAlO), other metal oxide, other metal nitride, or a combination thereof. In some embodiments, hard masks 92 include an amorphous semiconductor material, such as amorphous silicon. In some embodiments, hard masks 92 are formed by depositing a hard mask material that fills recesses formed over gates 90U (e.g., recesses having sidewalls formed by gate spacers 44 and bottoms formed by recessed gates 90U) and planarizing the hard mask material.

In some embodiments, fabricating stacked device structure 10A may further include forming interconnects, such as gate contacts and/or source/drain contacts. For example, upper source/drain contacts may be formed in the dielectric layer (e.g., ILD layer 72U and/or CESL 70U) on epitaxial source/drains 62U and lower source/drain contacts may be formed on epitaxial source/drains 62L. In some embodiments, a source/drain via may be formed that electrically connects a respective epitaxial source/drain 62U and a respective epitaxial source/drain 62L. In such embodiments, the source/drain via may be physically and/or electrically connected to an upper source/drain contact formed on the respective epitaxial source/drain 62U and a lower source/drain contact formed on the respective epitaxial source/drain 62L. Forming the source/drain contacts may include forming source/drain contact openings in the dielectric layer (or substrate 14) that expose epitaxial source/drains 62U (or epitaxial source/drains 62L) and forming at least one electrically conductive layer in the source/drain contact openings. In some embodiments, forming the source/drain contact openings includes forming a patterned mask layer (e.g., an etch mask) over the dielectric layer (or substrate) and etching exposed portions of the dielectric layer (or substrate). In some embodiments, forming at least one electrically conductive layer in the source/drain contact openings includes forming metal silicide layers over the epitaxial source/drains, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of the dielectric layer and/or the gate structures. A source/drain contact may thus include a metal silicide layer, a barrier/liner layer, and a bulk metal layer, where the barrier/liner layer is between the bulk metal layer and the dielectric layer (or substrate) and the bulk metal layer and the metal silicide layer. In some embodiments, one or more insulation layers may be formed in the source/drain contact openings and processed to form contact spacers, such as dielectric layers and/or air gaps, along sidewalls of electrically conductive portions of the source/drain contacts.

Figure 5:
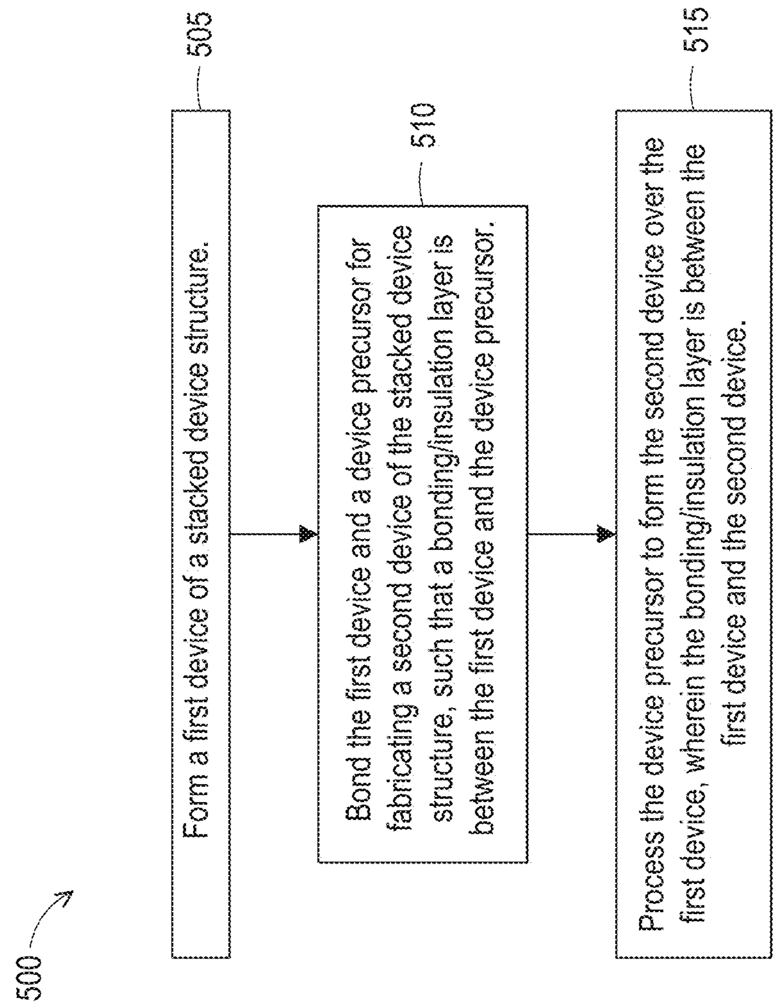
FIG. 5 is a flow chart of a method for sequentially fabricating a stacked device structure, such as the stacked device structure of FIG. 1B, that implements the bonding methods of FIGS. 2A-2E, according to various aspects of the present disclosure.

FIG. 5 is a flow chart of a method 500 for sequentially fabricating a stacked device structure, such as stacked device structure 10B of FIG. 1B, that implements the bonding methods of FIG. 2A-2E, according to various aspects of the present disclosure. In FIG. 5, method 500 at block 505 includes forming a first device (e.g., device 12L) of a stacked device structure. Method 500 may proceed to block 510, which includes bonding the first device and a device precursor for fabricating a second device (e.g., device 12U) of the stacked device structure. For example, method 100 of FIG. 2A is implemented at block 510 to bond the first device and the device precursor. After bonding at block 510, a bonding/insulation layer is between the first device and the device precursor. From block 510, method 500 may then proceed to processing the device precursor to form the second device over the first device at block 515. After processing, the bonding/insulation layer between the first device and the second device may provide isolation structure 17B therebetween, as discussed above with reference to the sequentially fabricated device structure 10B. FIG. 5 has been simplified for the sake of clarity to better understand the inventive concepts of the present disclosure. Additional steps may be provided before, during, and after method 500, and some of the steps described may be moved, replaced, or eliminated for additional embodiments of method 500.

FIGS. 6A-6H are cross-sectional views of stacked device structure 10B, in portion or entirety, at various sequential fabrication stages, such as those associated with method 500 of FIG. 5 when implementing a bonding technique (e.g., block 510 of method 500), such as that described with reference to FIGS. 2A-2E, according to various aspects of the present disclosure. FIGS. 6A-6H have been simplified for the sake of clarity to better understand the inventive concepts of the present disclosure. Additional steps may be provided before, during, and after the sequential fabrication steps of FIGS. 6A-6H, and some of the steps described may be moved, replaced, or eliminated for additional embodiments of the sequential fabrication steps of FIGS. 6A-6H. Additional features may be added in stacked device structure 10B of FIGS. 6A-6H, and some of the features described below may be replaced, modified, or eliminated in other embodiments of stacked device structure 10B of FIGS. 6A-6H.

Figure 6A:
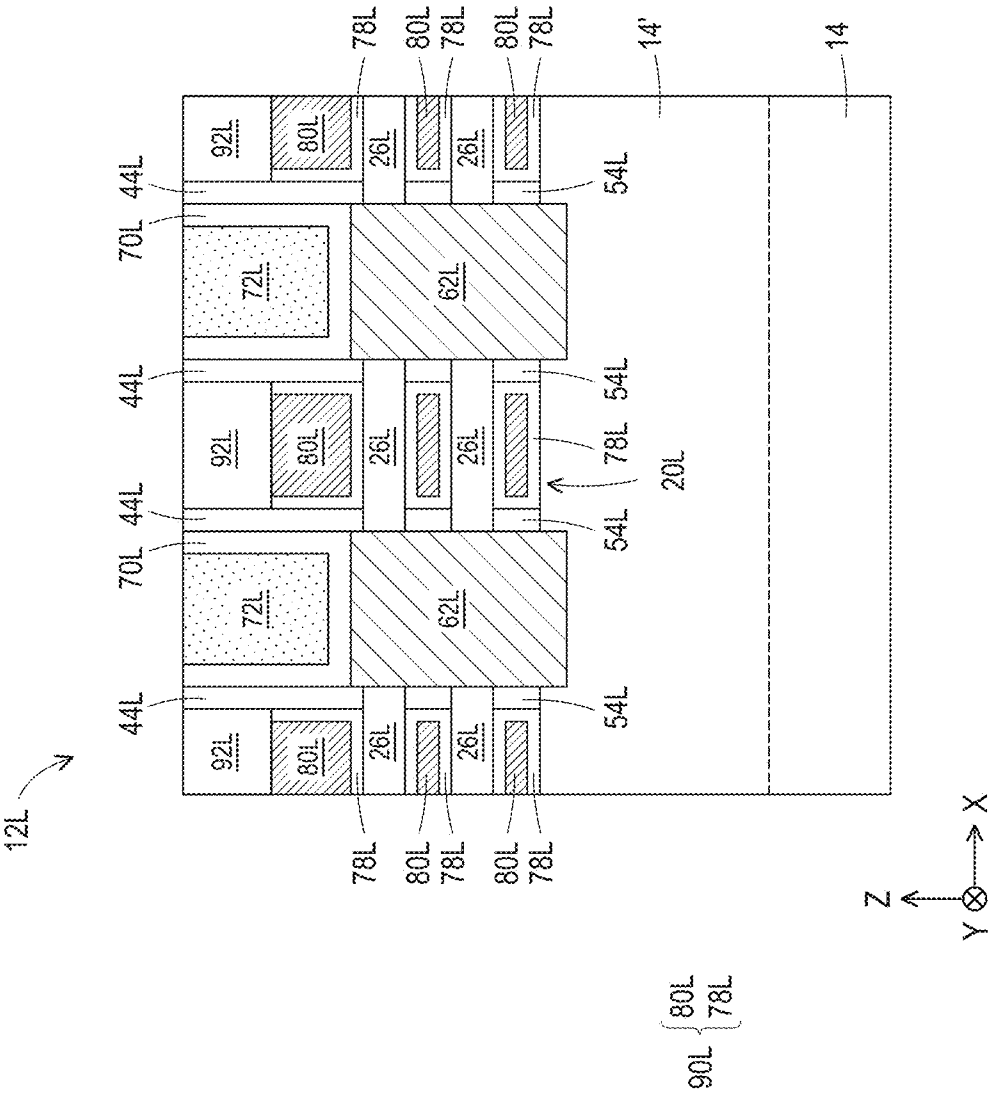
FIGS. 6A, 6B, 6C, 6D, 6E, 6F, 6G, and 6H are cross-sectional views of a stacked device structure, in portion or entirety, at various fabrication stages, such as those associated with the methods of FIG. 5 and FIGS. 2A-2E, according to various aspects of the present disclosure.

Referring to FIG. 6A, fabricating stacked device structure 10B includes forming device 12L. Forming device 12L may include forming a semiconductor layer stack over a respective substrate 14 and patterning the semiconductor layer stack (and, in some embodiments, substrate 14) to form a fin extending from substrate 14. The semiconductor layer stack may be similar to semiconductor layer stack 310L. For example, the semiconductor layer stack may include first semiconductor layers (e.g., semiconductor layers 26) and second semiconductor layers stacked vertically (e.g., along the z-direction) in an interleaving and/or alternating configuration from a top surface of substrate 14. The second semiconductor layers (e.g., silicon germanium layers) may be similar to semiconductor layers 315 described above with reference to FIG. 4A. The fin may be similar to fin 326. For example, the fin may include a patterned portion of semiconductor layer stack and a patterned portion of substrate 14 (i.e., mesa 14'), such as described above with reference to FIG. 4F (e.g., semiconductor layer stack 310L over mesa 14', respectively). In some embodiments, forming device 12L may include forming substrate isolation structures, such as substate isolation structures 328, adjacent to and/or surrounding a lower portion of the fin, such as described above with reference to FIG. 4G.

Forming device 12L may further include forming gate structures over channel regions of the fin, forming source/drain recesses in source/drain regions of the fin, and forming inner spacers 54L. In some embodiments, forming the gate structures includes forming at least one dummy gate layer (e.g., a dummy gate dielectric, a dummy gate electrode, and a hard mask layer) over the fin, patterning the at least one dummy gate layer to form dummy gate stacks, and forming gate spacers 44L along sidewalls of the dummy gate stacks. The dummy gate stacks and gate spacers 44L may be similar to dummy gate stacks 330 and gate spacers 44, respectively, described above with reference to FIG. 4H. In some embodiments, forming the source/drain recesses may include performing an etching process that selectively removes the first semiconductor layers and the semiconductor layers relative to the gate structures. Remainders of the first semiconductor layers (e.g., semiconductor layers 26) of the fin form channel layers 26L in the channel regions, such as described below and above with reference to FIG. 4I. In some embodiments, forming inner spacers 54L includes laterally etching the second semiconductor layers to form gaps between the first semiconductor layers and between the first semiconductor layers and mesas 14' and at least partially filling the gaps with a dielectric material (e.g., deposit and etch a dielectric layer(s)), such as described above with reference to FIG. 4I.

Forming device 12L may further include forming epitaxial source/drains 62L in the source/drain recesses and forming a dielectric layer (e.g., CESL 70L and ILD layer 72L) over epitaxial source/drains 62L, such as described above with reference to FIG. 4I. Forming device 12L may further include performing a gate replacement process (i.e., replacing dummy gate stacks with gates 90L (e.g., having gate dielectric 78L and gate electrode 80L)) and performing a channel release process, such as described above with reference to FIG. 4J. In some embodiments, the gate replacement process includes removing the dummy gate stacks to form gate openings in the gate structures, depositing gate dielectric layers that partially fill the gate openings, depositing gate electrode layers that fill remainders of the gate openings, and performing a planarization process to remove portions of the gate dielectric layers and/or portions of the gate electrode layers over the dielectric layer. In some embodiments, the channel release process is performed before depositing the gate dielectric layers. The channel release process may include selectively removing the second semiconductor layers, thereby suspending the first semiconductor layers (e.g., semiconductor layers 26) over substrate 14 to provide channel/semiconductor layers 26L and forming gaps in the gate openings between semiconductor layers 26L and between semiconductor layers 26L and mesa 14'. The gate dielectric layers and/or the gate electrode layers fill the gaps, such that the gate dielectric layers and/or the gate electrode layers may form around (e.g., surround) semiconductor layers 26L. In some embodiments, forming device 12L may further include forming hard masks 92L (e.g., SAC structures) over gates 90L, such as described above with reference to FIG. 4J.

In some embodiments, fabrication of device 12L may further include forming interconnects, such as gate contacts and/or source/drain contacts, of device 12L. For example, source/drain contacts may be formed in the dielectric layer (e.g., ILD layer 72L and/or CESL 70L) on epitaxial source/drains 62L. Forming the source/drain contacts may include forming source/drain contact openings in the dielectric layer that expose epitaxial source/drains 62L and forming at least one electrically conductive layer (e.g., metal) in the source/drain contact openings. In some embodiments, forming the source/drain contact openings includes forming a patterned mask layer (e.g., an etch mask) over the dielectric layer and etching exposed portions of the dielectric layer. In some embodiments, forming at least one electrically conductive layer in the source/drain contact openings includes forming metal silicide layers over epitaxial source/drains 62L, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of the dielectric layer and/or the gate structures. A source/drain contact may thus include a metal silicide layer, a barrier/liner layer, and a bulk metal layer, where the barrier/liner layer is between the bulk metal layer and the dielectric layer (e.g., CESL 70L) and the bulk metal layer and the metal silicide layer. In some embodiments, one or more insulation layers may be formed in the source/drain contact openings and processed to form contact spacers, such as dielectric layers and/or air gaps, along sidewalls of electrically conductive portions of the source/drain contacts.

Figure 6B:
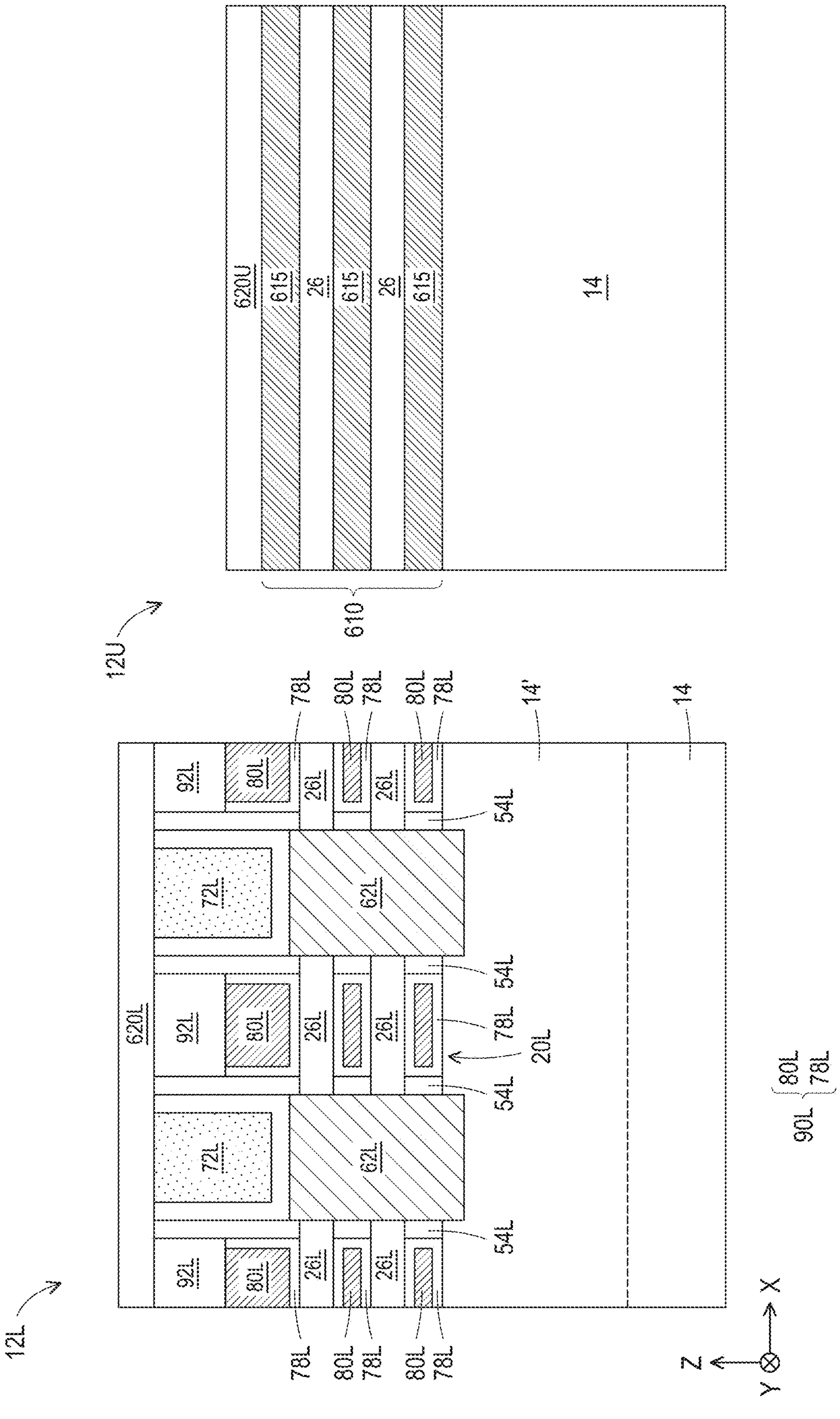
Figure 6C:
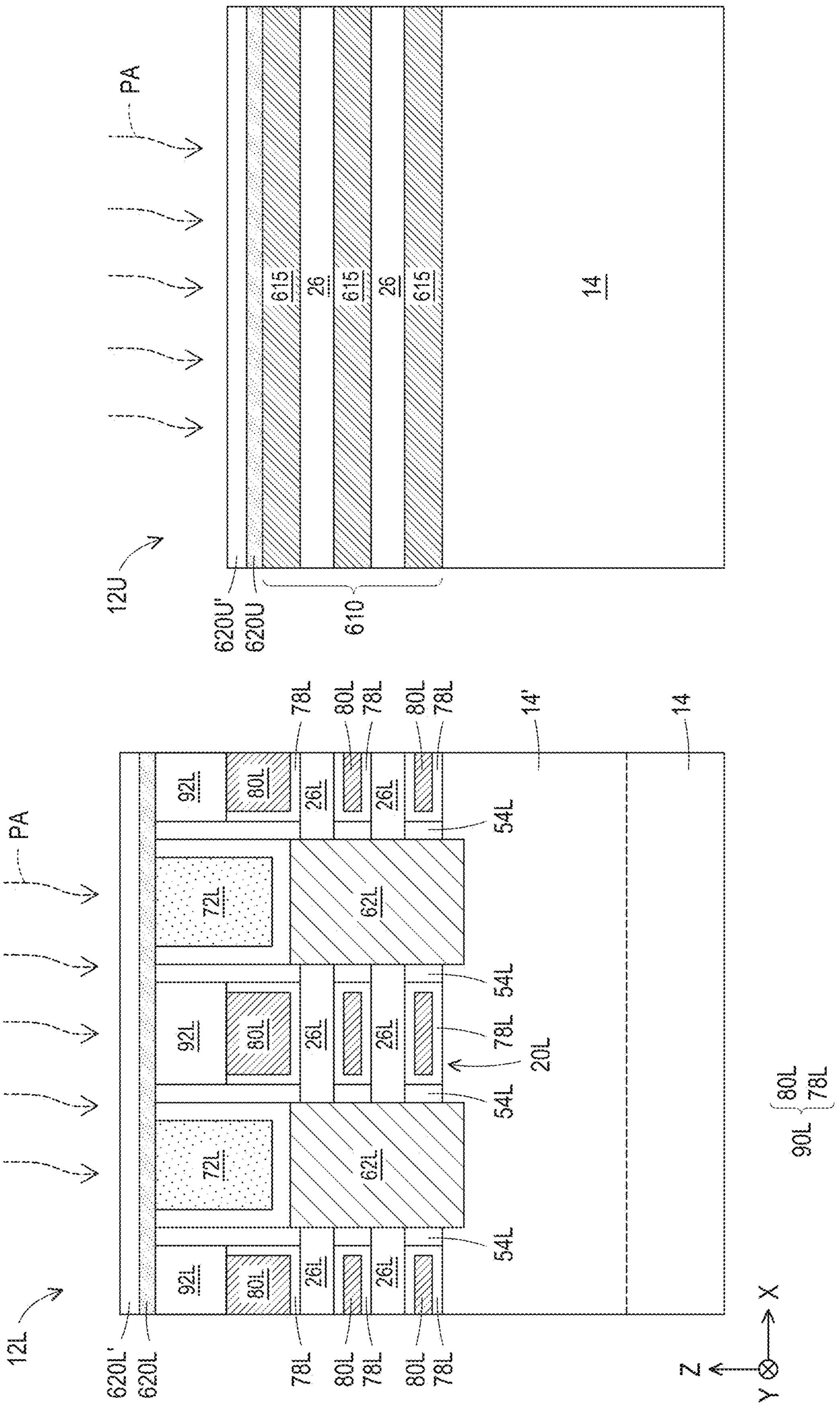
Figure 6D:
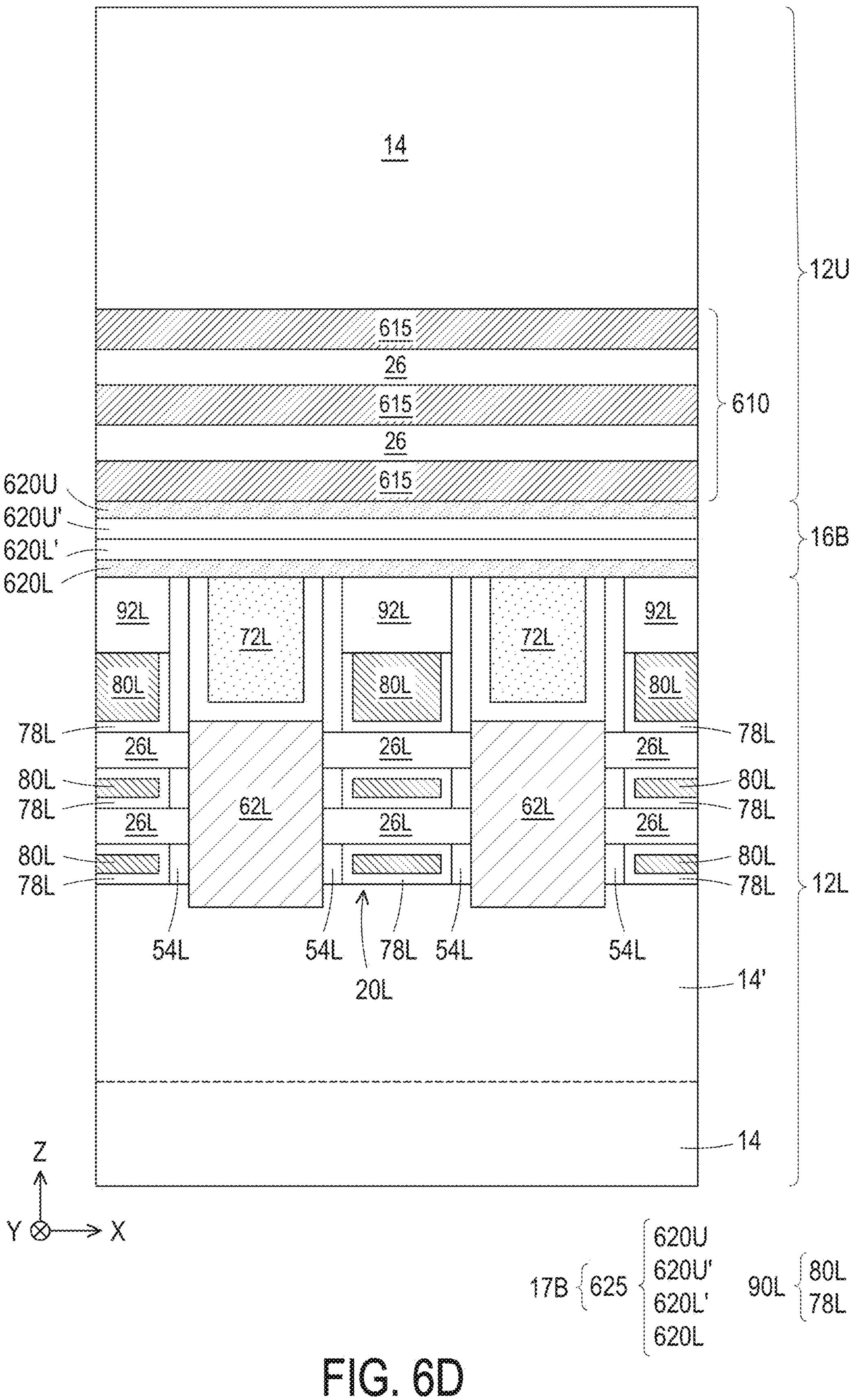

Referring to FIGS. 6B-6D, fabricating stacked device structure 10B includes bonding device 12L and a device precursor for device 12U. The device precursor for device 12U includes a semiconductor layer stack 610 disposed over a respective substrate 14. Semiconductor layer stack 610 includes semiconductor layers 26 and semiconductor layers 615 stacked vertically (e.g., along the z-direction) in an interleaving and/or alternating configuration from a top surface of substrate 14. Semiconductor layers 615 (e.g., silicon germanium layers) may be similar to semiconductor layers 315 described above with reference to FIG. 4A.

In FIG. 6B, an insulation/bonding layer 620L is formed over device 12L (e.g., over a top surface and/or a frontside thereof formed by hard masks 92L, CESL 70L, ILD layer 72L, and gate spacers 44), and an insulation/bonding layer 620U is formed over semiconductor layer stack 610 (e.g., over a top semiconductor layer 615 thereof, which forms a backside of device 12U). Insulation layer 620L and insulation layer 620U may include a same material. In an example, insulation layer 620L and insulation layer 620U may be similar to insulation layer I1 and insulation layer I2, respectively, described above with reference to FIGS. 2A-2E. For example, in some embodiments, insulation layer 620L and insulation layer 620U may include a single dielectric layer (e.g., such as I-A, FIG. 2C) composed of a material that includes silicon and nitrogen (e.g., SiN) or silicon, nitrogen, and carbon (e.g., SiCN). In some cases, insulation layer 620L and insulation layer 620U may include a double dielectric layer (e.g., such as I-A and I-B, FIG. 2D), where the lower layer of the double dielectric layer (e.g., I-A) is composed of a material that includes silicon and nitrogen (e.g., SiN) or silicon, nitrogen, and carbon (e.g., SiCN), and the upper layer of the double dielectric layer (e.g., I-B) is composed of a material that includes silicon and oxygen (e.g., $SiO_2$) or silicon, oxygen, and nitrogen (e.g., SiON). In yet other embodiments, insulation layer 620L and insulation layer 620U may include a triple dielectric layer (e.g., such as I-A, I-B, and I-C, FIG. 2E, where the bottom layer of the triple dielectric layer (e.g., I-A) and the middle layer of the triple dielectric layer (e.g., I-C) are composed of a material that includes silicon and nitrogen (e.g., SiN) or silicon, nitrogen, and carbon (e.g., SiCN), and the upper layer of the triple dielectric layer (e.g., I-B) is composed of a material that includes silicon and oxygen (e.g., $SiO_2$) or silicon, oxygen, and nitrogen (e.g., SiON). In embodiments including the triple dielectric layer, the bottom layer of the triple dielectric layer (e.g., I-A) and the middle layer of the triple dielectric layer (e.g., I-C) may be composed of a same material (e.g., both the bottom layer and the middle layer include SiN, or both the bottom layer and the middle layer include SiCN). Alternatively, in embodiments including the triple dielectric layer, the bottom layer of the triple dielectric layer (e.g., I-A) and the middle layer of the triple dielectric layer (e.g., I-C) may be composed of different materials (e.g., the bottom layer includes SiN and the middle layer includes SiCN, or vice versa). Insulation layer 620L and insulation layer 620U may have a thickness that is in a range of between about 1-100 nm. In other embodiments, insulation layer 620L and insulation layer 620U may have a thickness that is about 5 nm to about 25 nm. Insulation layer 620L and insulation layer 620U may be formed by CVD, PECVD, ALD, PEALD, PVD, other suitable process, or a combination thereof.

In FIG. 6C, a shallow plasma activation process (PA) is performed on insulation layer 620L and insulation layer 620U. The shallow plasma activation process is similar to the plasma activation process described above with reference to FIGS. 2A-2E. Generally, the shallow plasma activation process may modify characteristics of portions of insulation layer 620L and insulation layer 620U, thereby providing a plasma activated portion 620L' and a plasma activated portion 620U', respectively. In some embodiments, each of the plasma activated portion 620L' and the plasma activated portion 620U' may have a thickness that is less than about 5 nm.

For embodiments in which the insulation layer 620L and insulation layer 620U include a single dielectric layer (e.g., such as I-A, FIG. 2C), the shallow plasma activation process may modify surface conditions of the single dielectric layer (e.g., I-A) to form a plasma activated layer (e.g., I-A') within an upper portion of the single dielectric layer (e.g., I-A), where the plasma activated layer (e.g., I-A') is disposed over a lower portion of the single dielectric layer (e.g., I-A) that remains untreated by the shallow plasma activation process. Thus, in embodiments including the single dielectric layer, the plasma activated portions 620L', 620U' may include the plasma activated layer (e.g., I-A'), and the non-plasma treated portions of insulation layer 620L and insulation layer 620U may include the non-plasma treated lower portion of the single dielectric layer (e.g., I-A).

For embodiments in which the insulation layer 620L and insulation layer 620U include a double dielectric layer (e.g., such as I-A and I-B, FIG. 2D), the shallow plasma activation process may modify surface conditions of the upper layer of the double dielectric layer (e.g., I-B) to form a plasma activated layer (e.g., I-B') within an upper portion of the upper layer of the double dielectric layer (e.g., I-B), where the plasma activated layer (e.g., I-B') is disposed over a lower portion of the upper layer of the double dielectric layer (e.g., I-B) that remains untreated by the plasma activation process, and where the untreated lower portion of the upper layer of the double dielectric layer (e.g., I-B) interposes the lower layer of the double dielectric layer (e.g., I-A) and the plasma activated layer (e.g., I-B'). Thus, in embodiments including the double dielectric layer, the plasma activated portions 620L', 620U' may include the plasma activated layer (e.g., I-B'), and the non-plasma treated portions of insulation layer 620L and insulation layer 620U may include the non-plasma treated lower portion of the upper layer of the double dielectric layer (e.g., I-B) and the lower layer of the double dielectric layer (e.g., I-A).

For embodiments in which the insulation layer 620L and insulation layer 620U include a triple dielectric layer (e.g., such as I-A, I-B, and I-C, FIG. 2E), the shallow plasma activation process may modify surface conditions of the upper layer of the triple dielectric layer (e.g., I-B) to form a plasma activated layer (e.g., I-B') within an upper portion of the upper layer of the triple dielectric layer (e.g., I-B), where the plasma activated layer (e.g., I-B') is disposed over a lower portion of the upper layer of the triple dielectric layer (e.g., I-B) that remains untreated by the plasma activation process, and where the untreated lower portion of the upper layer of the triple dielectric layer (e.g., I-B) interposes the middle layer of the triple dielectric layer (e.g., I-C) and the plasma activated layer (e.g., I-B'). Thus, in embodiments including the triple dielectric layer, the plasma activated portions 620L', 620U' may include the plasma activated layer (e.g., I-B'), and the non-plasma treated portions of insulation layer 620L and insulation layer 620U may include the non-plasma treated lower portion of the upper layer of the triple dielectric layer (e.g., I-B), the middle layer of the triple dielectric layer (e.g., I-C), and the lower layer of the triple dielectric layer (e.g., I-A).

Parameters of the shallow plasma activation process may be tuned to promote and/or enhance bonding between insulation layer 620L and insulation layer 620U by causing $OH^-$ groups to form on top, bonding surfaces thereof. The shallow plasma activation process may thus be used to form hydroxides on top surfaces of the insulation layer 620L and insulation layer 620U. In some embodiments, the shallow plasma activation process is an oxygen plasma treatment, an oxygen-hydrogen plasma treatment, or other suitable plasma treatment. In some embodiments, the shallow plasma activation process may be performed at a temperature of less than about 400 degrees Celsius. In some cases, a cleaning process may be performed (e.g., to top surfaces of the insulation layers 620L, 620U before plasma activation, to top surfaces the plasma activated portions 620L', 620U' after plasma activation, or a combination thereof). Such a cleaning process may be performed using an RCA cleaning process including an SC-1 clean (ammonium hydroxide, hydrogen peroxide, and water) and/or an SC-2 clean (hydrochloric acid, hydrogen peroxide, and water). In some examples, the cleaning process may additionally or alternatively include a DI rinse applied to the plasma activated portion 620L' and/or the plasma activated portion 620U'.

In FIG. 6D, the device precursor of device 12U (e.g., a backside thereof) is attached and/or bonded to device 12L (e.g., a frontside thereof). The attaching/bonding may include flipping over the device precursor of device 12U, aligning the device precursor of device 12U with device 12L, contacting the device precursor of device 12U to device 12L, and performing an annealing process, thereby providing a stacked device structure. For example, plasma activated portion 620U' is brought into contact with plasma activated portion 620L' (or vice versa) under a temperature, a pressure, an atmosphere, or a combination thereof for a time that effectuates bonding of plasma activated portion 620U' and plasma activated portion 620L'. Surface OH groups of plasma activated portion 620U' and plasma activated portion 620L' enhance and/or improve bonding therebetween. After bonding, device 12L is attached to and electrically isolated from the device precursor of device 12U by an insulation/bonding layer 625, which includes insulation layer 620L, plasma activated portion 620L', insulation layer 620U, and plasma activated portion 620U'. Accordingly, at this stage of processing, insulation/bonding layer 625 provides isolation structure 16B of stacked device structure 10B, which electrically isolates and separates device 12L and device 12U. In some embodiments, a thickness of insulation/bonding layer 625 is about 1-100 nm. In some cases, the thickness of insulation/bonding layer 625 is about 10 nm to about 50 nm. In some embodiments, plasma activated portion 620U' and plasma activated portion 620L' are bonded using dielectric-to-dielectric bonding. In some embodiments, the bonding includes performing an annealing process, after contacting the device precursor of device 12U to device 12L, to effectuate bonding of plasma activated portion 620U' and plasma activated portion 620L'. In some examples, the annealing process serves to effectuate bonding of the device precursor of device 12U to device 12L by forming bonds between the plasma activated portions 620L', 620U' (e.g., such as Si—C—Si bonds and/or Si—O—Si bonds). The annealing process, in some cases, may also serve to cause dehydration (e.g., of $H_2O$).

In embodiments where the insulation layer 620L and insulation layer 620U include a single dielectric layer (e.g., such as I-A, FIG. 2C), the insulation/bonding layer 625 includes the insulation layers 620L, 620U (each including a non-plasma treated lower portion of the single dielectric layer (e.g., I-A)) and the plasma activated portions 620L', 620U' (each including the plasma activated layer (e.g., I-A')). In embodiments where the insulation layer 620L and insulation layer 620U include a double dielectric layer (e.g., such as I-A and I-B, FIG. 2D), the insulation/bonding layer 625 includes the insulation layers 620L, 620U (each including a non-plasma treated lower portion of the upper layer of the double dielectric layer (e.g., I-B) and a lower layer of the double dielectric layer (e.g., I-A)) and the plasma activated portions 620L', 620U' (each including the plasma activated layer (e.g., I-B')). In embodiments where the insulation layer 620L and insulation layer 620U include a triple dielectric layer (e.g., such as I-A, I-B, and I-C, FIG. 2E), the insulation/bonding layer 625 includes the insulation layers 620L, 620U (each including a non-plasma treated lower portion of the upper layer of the triple dielectric layer (e.g., I-B), a middle layer of the triple dielectric layer (e.g., I-C), and a lower layer of the triple dielectric layer (e.g., I-A)) and the plasma activated portions 620L', 620U' (each including the plasma activated layer (e.g., I-B')).

Figure 6E:
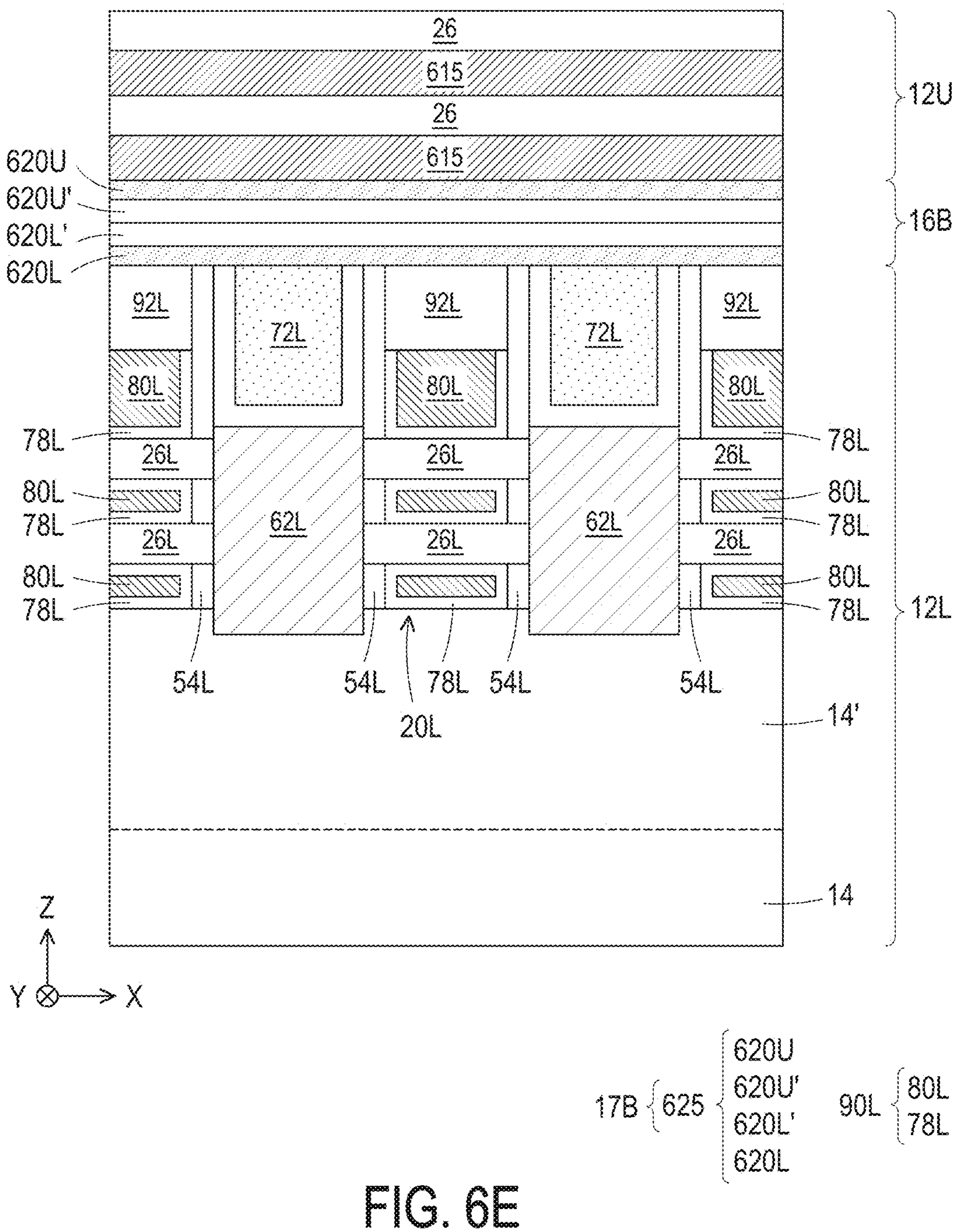
Figure 6F:
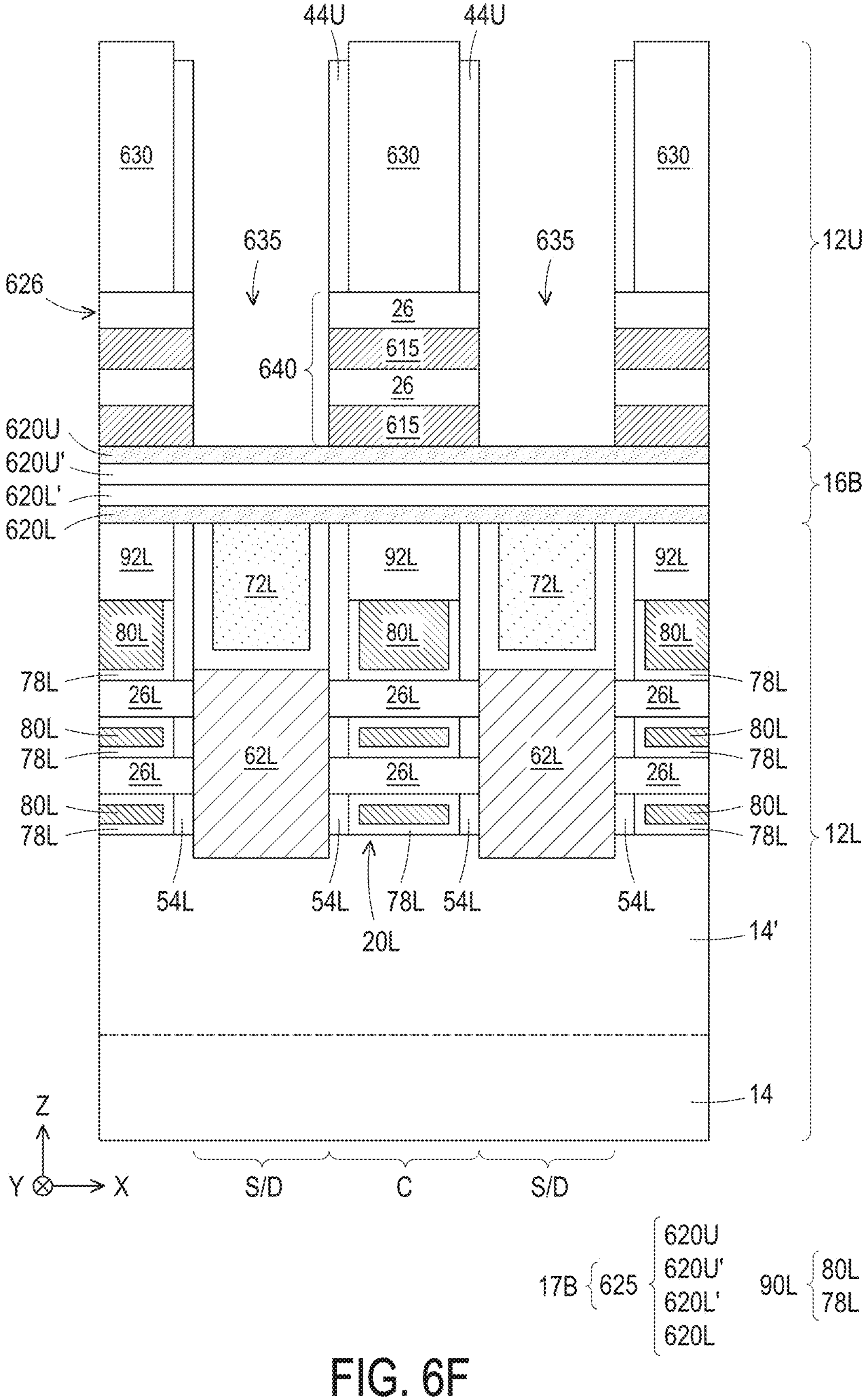
Figure 6G:
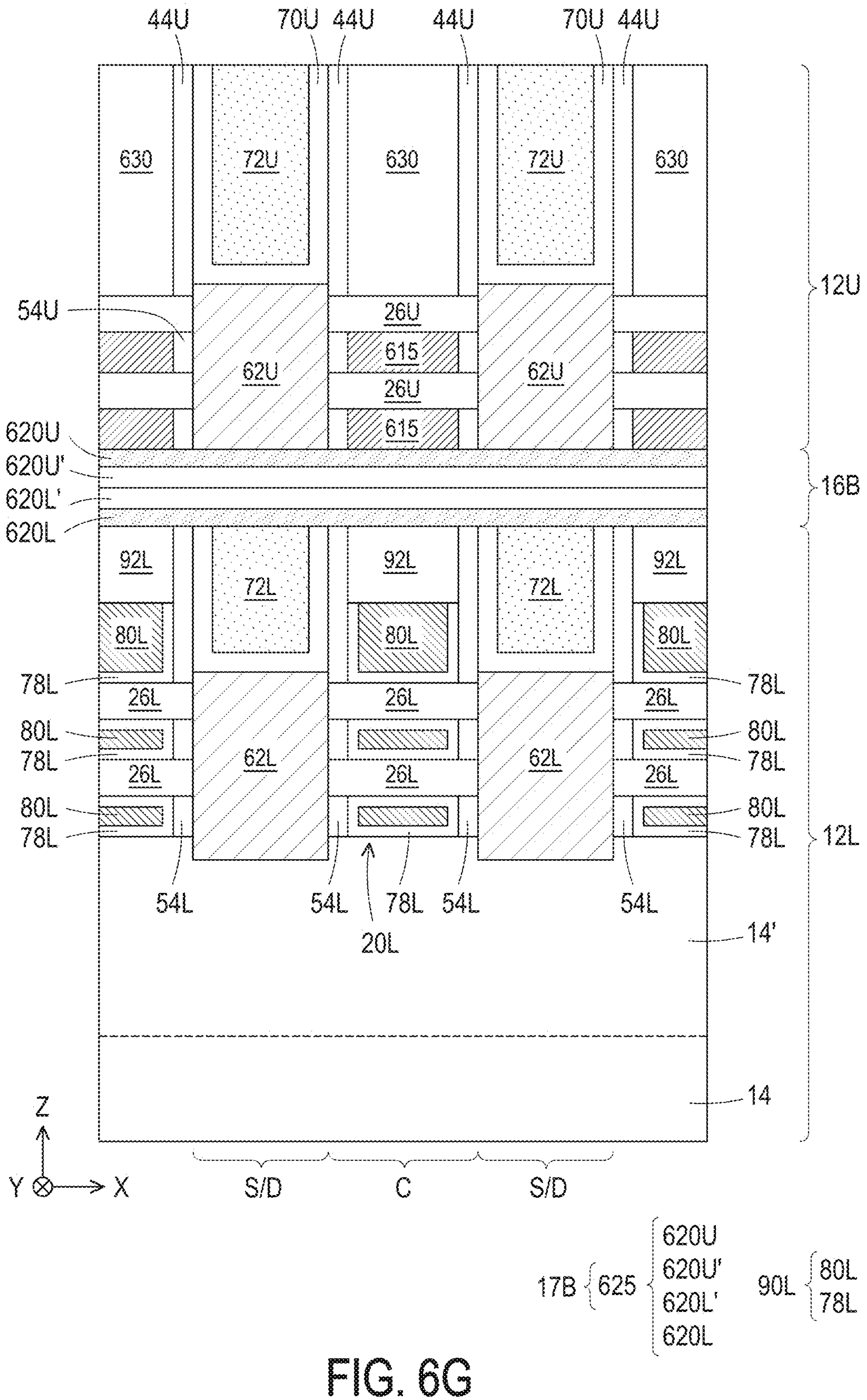
Figure 6H:
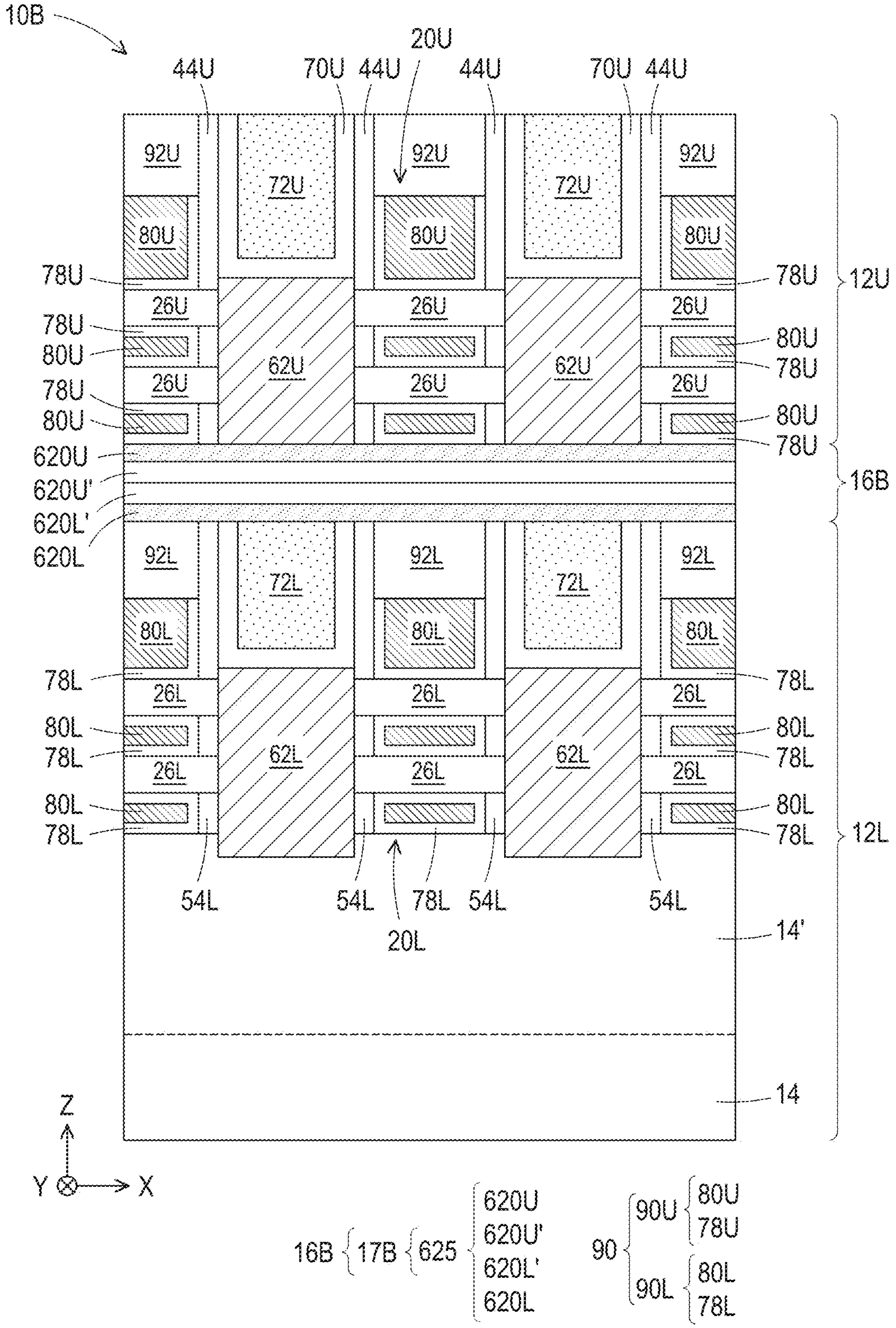

Referring to FIG. 6E, fabricating stacked device structure 10B includes performing a thinning process to remove substrate 14 and top semiconductor layer 615 from the device precursor of device 12U, such as described above with reference to FIG. 4E. Referring to FIGS. 6F-6H, fabricating stacked device structure 10B includes processing the device precursor to form device 12U. In FIG. 6F, processing the device precursor may include patterning semiconductor layer stack 610 to form fins 626 extending from isolation structure 16B, forming dummy gate stacks 630 over portions of fins 626, forming gate spacers 44U along sidewalls of dummy gate stacks 630, and forming source/drain recesses 635. Dummy gate stacks 630 extend lengthwise in a direction that is different than (e.g., orthogonal to) the lengthwise direction of fins 626. For example, dummy gate stacks 630 extend along the y-direction, having a length in the y-direction, a width in the x-direction, and a height in the z-direction. In the X-Z plane, dummy gate stacks 630 are disposed over tops of channel regions (C) of fins 626 and/or stacked device structure 10B, and dummy gate stacks 630 are disposed between source/drain regions (S/D) of fins 626 and/or stacked device structure 10B. In the Y-Z plane, dummy gate stacks 630 may be disposed on tops and sidewalls of fins 626, and dummy gate stacks 630 may wrap channel regions. Dummy gate stacks 630 may be similar to dummy gate stacks 330, such as described above with reference to FIG. 4H. For example, dummy gate stacks 630 may include a dummy gate dielectric, a dummy gate electrode, a hard mask, other suitable layers, or a combination thereof.

Source/drain recesses 635 may be formed by performing an etching process that removes semiconductor layer stack 610 in source/drain regions of fins 626, thereby exposing insulation/bonding layer 625 (e.g., insulation layer 620U thereof). Each source/drain recess 635 has respective sidewalls formed by respective remaining portions of semiconductor layer stack 610 in channel regions of fins 626 and a bottom formed by insulation layer 625. In the depicted embodiment, after forming source/drain recesses 635, each channel region has a channel portion 640 formed by a remainder of semiconductor layer stack 610. Channel portion 640 is separated from a channel portion/gate portion of device 12L by bonding/isolation layer 625. The etching process is a dry etch, a wet etch, other suitable etch, or a combination thereof. In some embodiments, the etching process is a multistep etch process.

In FIG. 6G, fabricating stacked device structure 10B may include forming inner spacers 54U under gate spacers 44U along sidewalls of semiconductor layers 615, such as described above with reference to FIG. 4I; forming epitaxial source/drains 62U in source/drain recesses 635, such as described above with reference to FIG. 4I; and forming a dielectric layer (e.g., CESL 70U and ILD layer 72U) over epitaxial source/drains 62U, such as described above with reference to FIG. 4I. Epitaxial source/drains 62U are disposed vertically over epitaxial source/drains 62L, and epitaxial source/drains 62U may be electrically isolated from epitaxial source/drains 62L and/or source/drain contacts thereto (such as source/drain contacts disposed in ILD layer 72L and/or CESL 70L, which may extend from bonding/isolation layer 625 to epitaxial source/drains 62L) by bonding/insulation layer 625. Semiconductor layers 26 extending between epitaxial source/drains 62U may be referred to as upper semiconductor layers 26U. The dielectric layer may be formed by depositing CESL 70U over epitaxial source/drains 62U, depositing ILD layer 72L over CESL 70L, and performing a planarization process, which may stop upon reaching the gate structures (e.g., dummy gate stacks 630).

In FIG. 6H, fabricating stacked device structure 10B may include performing a gate replacement process (i.e., replacing dummy gate stacks 630 with gates 90U (e.g., having gate dielectric 78U and gate electrode 80U)) and performing a channel release process, such as described above with reference to FIG. 4J. In some embodiments, the gate replacement process includes removing the dummy gate stacks to form gate openings in gate structures, depositing gate dielectric layers that partially fill the gate openings, depositing gate electrode layers that fill remainders of the gate openings, and performing a planarization process to remove portions of the gate dielectric layers and/or portions of the gate electrode layers over the dielectric layer. In some embodiments, the channel release process is performed before depositing the gate dielectric layers. The channel release process may include selectively removing semiconductor layers 615, thereby suspending semiconductor layers 26 over substrate 14 to provide channels for device 12U (which are designated as semiconductor layers 26U) and forming gaps in the gate openings between semiconductor layers 26U and between semiconductor layers 26U and isolation structure 16B. The gate dielectric layers and/or the gate electrode layers fill the gaps, such that the gate dielectric layers and/or the gate electrode layers may form around semiconductor layers 26U. In some embodiments, forming device 12U may further include forming hard masks 92U (e.g., SAC structures) over gates 90U, such as described above with reference to FIG. 4J. In some embodiments, fabricating stacked device structure 10B may further include forming interconnects, such as gate contacts and/or source/drain contacts, of device 12U. For example, source/drain contacts may be formed in the dielectric layer (e.g., ILD layer 72U and/or CESL 70U) on epitaxial source/drains 62U, such as described above with reference to FIG. 6A. In some embodiments, a source/drain via may be formed that electrically connects a respective epitaxial source/drain 62U and a respective epitaxial source/drain 62L. In such embodiments, the source/drain via may be physically and/or electrically connected to a first source/drain contact formed on the respective epitaxial source/drain 62U and a second source/drain contact formed on the respective epitaxial source/drain 62L.

In the depicted embodiment, isolation structure 16B is provided by isolation structure 17B, which separates and/or electrically isolates both channel regions and source/drain regions of device 12U and device 12L. For example, each channel region has two upper semiconductor layers 26U (upper channel layers) and two lower semiconductor layers 26L (lower channel layers) surrounded and/or wrapped by gate 90U and gate 90L, respectively, and gate 90U is separated and/or electrically isolated from gate 90L by isolation structure 17B. Semiconductor layers 26U are vertically stacked along the z-direction and provide two channels for transistor 20U through which current may flow between epitaxial source/drains 62U, and semiconductor layers 26L are vertically stacked along the z-direction and provide two channels for transistor 20L through which current may flow between epitaxial source/drains 62L. Further, epitaxial source/drains 62U may be separated and/or electrically isolated from epitaxial source/drains 62L and/or source/drain contacts thereto (such as source/drain contacts disposed in ILD layer 72L and/or CESL 70L, which may extend from bonding/isolation layer 625 to epitaxial source/drains 62L)) by isolation structure 17B, where the isolation structure 17B is formed by the insulation/bonding layer 625.

Devices and/or structures described herein, such as stacked device structure 10A, stacked device structure 10B, device 12L, device 12U, transistor 20L, transistor 20U, etc. may be included in a microprocessor, a memory, other IC device, or a combination thereof. In some embodiments, devices and/or structures described herein, such as stacked device structure 10A, stacked device structure 10B, device 12L, device 12U, transistor 20L, transistor 20U, etc. described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other devices, or a combination thereof.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to bonding techniques for stacked device structures, such as stacked transistor structures. In some embodiments, a method for controlling a region of a plasma activated surface to within a few nanometers (e.g., also referred to as shallow plasma activation) is provided, while also introducing a dielectric layer (e.g., such as SiCN, SiN, or a combination thereof) that provides a high barrier for diffusion of $H_2O$. As a result, embodiments disclosed herein ensure that an underlying superlattice structure or CFET channel layer is not impacted by the surface plasma treatment (e.g., used for plasma activated wafer bonding), nor is there $H_2O$ induced oxidation to the superlattice structure or CFET channel layer. In some embodiments, a separate barrier layer may be deposited before the dielectric layer, which provides a bonding dielectric layer. In other embodiments, the deposited dielectric layer serves both as the bonding dielectric layer and as the barrier layer. Other embodiments may include different numbers of dielectric and/or barrier layers having various compositions, as described herein.

Thus, one of the embodiments of the present disclosure described a method including forming a first insulation layer on a first device component and a second insulation layer on a second device component. In some embodiments, the method further includes performing a plasma activation process to the first insulation layer and the second insulation layer. In an example, and after the plasma activation process, an upper portion of the first insulation layer and the second insulation layer includes a plasma activated layer and a lower portion of the first insulation layer and the second insulation layer includes a barrier layer. In some embodiments, the method further includes bonding the plasma activated layers of respective ones of the first insulation layer and the second insulation layer to form a stacked structure that includes the first device component over the second device component. In various examples, the first insulation layer bonded to the second insulation layer forms an isolation structure between the first device component and the second device component.

In another of the embodiments, discussed is a method including forming a first insulation layer on a first substrate having a first superlattice structure or a first transistor channel layer and a second insulation layer on a second substrate having a second superlattice structure or a second transistor channel layer. In some embodiments, the method further includes performing a plasma activation process to the first insulation layer and the second insulation layer to form a plasma activated layer having a plasma activated surface within each of the first and second insulation layers. In some examples, non-plasma treated portions of the first and second insulation layers include a barrier layer. In some embodiments, the method further includes contacting the plasma activated surfaces of the first and second insulation layers. Thereafter, in some embodiments, the method further includes performing an annealing process to bond the contacted plasma activated surfaces to form a stacked structure including a bonding layer between the first substrate and the second substrate. In an example, the bonding layer isolates the first substrate from the second substrate.

In yet another of the embodiments, discussed is a semiconductor device including a transistor stack having a first transistor disposed over a second transistor. In some embodiments, the first transistor includes first semiconductor layers, a first gate stack, and first source/drains. The first semiconductor layers are disposed between the first source/drains, and the first gate stack is disposed between the first source/drains and wraps the first semiconductor layers. In some examples, the second transistor includes second semiconductor layers, a second gate stack, and second source/drains. The second semiconductor layers are disposed between the second source/drains, and the second gate stack is disposed between the second source/drains and wraps the second semiconductor layers. In some embodiments, the first source/drains are disposed over the second source/drains and the first gate stack is disposed over the second gate stack. In some examples, the semiconductor device further includes an insulation layer disposed between the first gate stack and the second gate stack. In some embodiments, the insulation layer includes bonding layer portions having plasma activated layers and barrier layer portions interposing the bonding layer portions and respective ones of the first gate stack and the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first insulation layer on a first device component;

forming a second insulation layer on a second device component;

performing a plasma activation process to the first insulation layer and the second insulation layer, wherein the plasma activation process forms a plasma activated layer within an upper portion of the first insulation layer and the second insulation layer, and wherein a lower portion of the first insulation layer and the second insulation layer are untreated by the plasma activation process and define a barrier layer; and bonding the plasma activated layers of respective ones of the first insulation layer and the second insulation layer to form a stacked structure that includes the first device component over the second device component, wherein the first insulation layer bonded to the second insulation layer forms an isolation structure between the first device component and the second device component.

2. The method of claim 1, wherein the first insulation layer and the second insulation layer include a single dielectric layer composed of silicon nitride (SiN) or silicon carbonitride (SiCN).

3. The method of claim 2, wherein the barrier layer includes a non-plasma treated portion of the single dielectric layer.

4. The method of claim 1, wherein the first insulation layer and the second insulation layer include a double dielectric layer, wherein a lower layer of the double dielectric layer is composed of silicon nitride (SiN) or silicon carbonitride (SiCN), and wherein an upper layer of the double dielectric layer is composed of silicon dioxide ($SiO_2$) or silicon oxynitride (SiON).

5. The method of claim 4, wherein the barrier layer includes the lower layer of the double dielectric layer and a non-plasma treated portion of the upper layer of the double dielectric layer.

6. The method of claim 1, wherein the first insulation layer and the second insulation layer include a triple dielectric layer, wherein a bottom layer of the triple dielectric layer and a middle layer of the triple dielectric layer are composed of silicon nitride (SiN) or silicon carbonitride (SiCN), and wherein an upper layer of the triple dielectric layer is composed of silicon dioxide ($SiO_2$) or silicon oxynitride (SiON).

7. The method of claim 6, wherein the barrier layer includes the bottom layer of the triple dielectric layer, the middle layer of the triple dielectric layer, and a non-plasma treated portion of the upper layer of the triple dielectric layer.

8. The method of claim 6, wherein the bottom layer and the middle layer of the triple dielectric layer are the same.

9. The method of claim 6, wherein the bottom layer and the middle layer of the triple dielectric layer are different.

10. A method comprising:

forming a first insulation layer on a first substrate, wherein the first substrate includes a first superlattice structure of alternating semiconductor layers or a first transistor channel layer;

forming a second insulation layer on a second substrate, wherein the second substrate includes a second superlattice structure of alternating semiconductor layers or a second transistor channel layer;

performing a plasma activation process to the first insulation layer and the second insulation layer to form a plasma activated layer having a plasma activated surface within each of the first and second insulation layers, wherein non-plasma treated portions of the first and second insulation layers define a barrier layer;

contacting the plasma activated surfaces of the first and second insulation layers; and performing an annealing process to bond the contacted plasma activated surfaces to form a stacked structure including a bonding layer between the first substrate and the second substrate, wherein the bonding layer isolates the first substrate from the second substrate.

11. The method of claim 10, wherein the first insulation layer and the second insulation layer include a single dielectric layer, a double dielectric layer, or a triple dielectric layer.

12. The method of claim 11, wherein the single dielectric layer includes silicon nitride (SiN) or silicon carbonitride (SiCN).

13. The method of claim 11, wherein the double dielectric layer includes a lower layer composed of silicon nitride (SiN) or silicon carbonitride (SiCN) and an upper layer composed of silicon dioxide ($SiO_2$) or silicon oxynitride (SiON).

14. The method of claim 11, wherein the triple dielectric layer includes a bottom layer and a middle layer composed of silicon nitride (SiN) or silicon carbonitride (SiCN) and an upper layer composed of silicon dioxide ($SiO_2$) or silicon oxynitride (SiON).

15. The method of claim 10, wherein the plasma activation process is an oxygen plasma treatment.

16. The method of claim 10, wherein the plasma activated surface includes OH dangling bonds.

17. The method of claim 10, wherein the performing the annealing process to bond the contacted plasma activated surfaces forms at least one of Si—C—Si bonds and Si—O—Si bonds between the plasma activated layers of respective ones of the first insulation layer and the second insulation layer.

18. A semiconductor device comprising:

a transistor stack having a first transistor disposed over a second transistor, wherein:

the first transistor has first semiconductor layers, a first gate stack, and first source/drains, wherein the first semiconductor layers are disposed between the first source/drains, the first gate stack is disposed between the first source/drains and wraps the first semiconductor layers, the second transistor has second semiconductor layers, a second gate stack, and second source/drains, wherein the second semiconductor layers are disposed between the second source/drains, the second gate stack is disposed between the second source/drains and wraps the second semiconductor layers, and the first source/drains are disposed over the second source/drains and the first gate stack is disposed over the second gate stack; and an insulation layer disposed between the first gate stack and the second gate stack, wherein the insulation layer includes a first dielectric layer and a second dielectric layer over the first dielectric layer, wherein the first dielectric layer includes a first non-plasma treated lower portion and a first plasma treated upper portion over the first non-plasma treated lower portion, wherein the second dielectric layer includes a second non-plasma treated lower portion and a second plasma treated upper portion over the second non-plasma treated lower portion, wherein the first and second non-plasma treated lower portions define barrier layers, wherein the first and second plasma treated upper portions define bonding layers, and wherein respective ones of the barrier layers interpose respective ones of the bonding layers and respective ones of the first gate stack and the second gate stack.

19. The semiconductor device of claim 18, wherein the first and second plasma treated upper portions include plasma activated portions of silicon dioxide ($SiO_2$) layers or silicon oxynitride (SiON) layers.

20. The semiconductor device of claim 18, wherein the non-plasma treated lower portions include silicon nitride (SiN) or silicon carbonitride (SiCN).

* * * * *